United States Patent
Lin et al.

(10) Patent No.: US 11,935,958 B2
(45) Date of Patent: Mar. 19, 2024

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Yu-Chao Lin, Hsinchu (TW); Wei-Sheng Yun, Taipei (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/190,625

(22) Filed: Mar. 27, 2023

(65) Prior Publication Data

US 2023/0231054 A1 Jul. 20, 2023

Related U.S. Application Data

(63) Continuation of application No. 17/729,333, filed on Apr. 26, 2022, now Pat. No. 11,616,146, which is a continuation of application No. 16/905,450, filed on Jun. 18, 2020, now Pat. No. 11,322,619.

(60) Provisional application No. 62/928,027, filed on Oct. 30, 2019.

(51) Int. Cl.
*H01L 29/78* (2006.01)
*H01L 29/06* (2006.01)
*H01L 29/66* (2006.01)

(52) U.S. Cl.
CPC ...... *H01L 29/7855* (2013.01); *H01L 29/0649* (2013.01); *H01L 29/0665* (2013.01); *H01L 29/6681* (2013.01)

(58) Field of Classification Search
CPC ....... H01L 21/02603; H01L 21/823431; H01L 21/823821; H01L 21/845; H01L 27/0866; H01L 27/0924; H01L 27/1211; H01L 2029/7858
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — David C Spalla
(74) *Attorney, Agent, or Firm* — Birch, Stewart, Kolasch & Birch, LLP

(57) ABSTRACT

A semiconductor device structure is provided. The semiconductor device structure includes a first stacked nanostructure and a second stacked nanostructure formed over a substrate. The semiconductor device structure includes a first gate structure formed over the first stacked nanostructure, and the first gate structure includes a first portion of a gate dielectric layer and a first portion of a filling layer. The semiconductor device structure includes a second gate structure formed over the second stacked nanostructure, and the second gate structure includes a second portion of the gate dielectric layer and a second portion of the filling layer. The semiconductor device structure includes a first isolation layer between the first gate structure and the second gate structure, wherein the first isolation layer has an extending portion which is formed in a recess between the gate dielectric layer and the filling layer.

20 Claims, 24 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,636,738 B2 | 1/2017 | Huang et al. | |
| 9,576,814 B2 | 2/2017 | Wu et al. | |
| 9,608,116 B2 | 3/2017 | Ching et al. | |
| 10,373,873 B1* | 8/2019 | Park | H01L 21/823418 |
| 2017/0084723 A1 | 3/2017 | Greene et al. | |
| 2019/0221653 A1* | 7/2019 | Hsiao | H01L 29/0649 |
| 2019/0378906 A1* | 12/2019 | Loubet | H01L 29/66742 |
| 2019/0393351 A1 | 12/2019 | Beattie et al. | |
| 2020/0052125 A1* | 2/2020 | Zhou | H01L 21/823821 |
| 2020/0135848 A1* | 4/2020 | Lim | H01L 21/823821 |
| 2020/0144255 A1* | 5/2020 | Lee | H01L 29/4966 |
| 2020/0350212 A1* | 11/2020 | Lallement | H01L 21/823468 |

\* cited by examiner

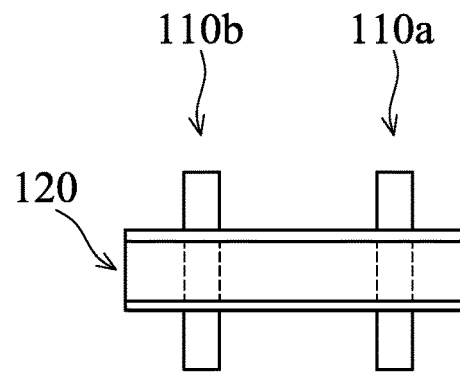
FIG. 3A
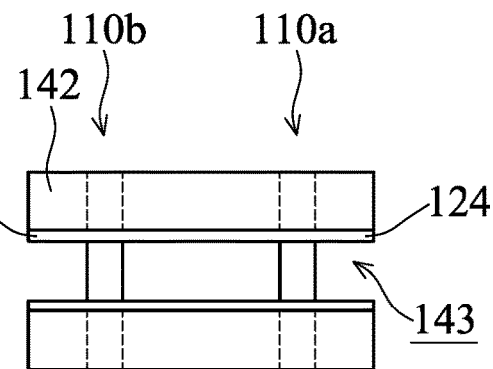
FIG. 3B
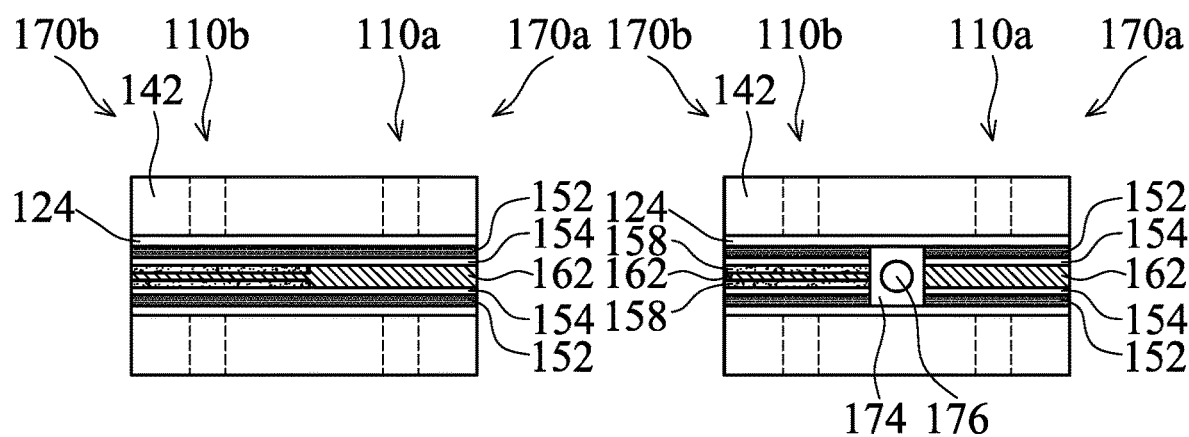
FIG. 3C
FIG. 3D

SEMICONDUCTOR DEVICE STRUCTURE AND METHOD FOR FORMING THE SAME

CROSS REFERENCE TO RELATED APPLICATIONS

This application is a Continuation application of U.S. patent application Ser. No. 17/729,333, filed on Apr. 26, 2022, which is a Continuation application of U.S. patent application Ser. No. 16/905,450, filed on Jun. 18, 2020, the entire of which is incorporated by reference herein, which claims the benefit of U.S. Provisional Application No. 62/928,027 filed on Oct. 30, 2019, and entitled "Package structure and method for forming the same", the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1I-1 and 1I-2 show cross-sectional representations of the semiconductor device structure along lines AA' and BB' shown in FIG. 1I, in accordance with some embodiments of the disclosure.

FIGS. 1J-1 and 1J-2 show cross-sectional representations of the semiconductor device structure along lines AA' and BB' shown in FIG. 1J, in accordance with some embodiments of the disclosure.

FIGS. 1K-1 and 1K-2 show cross-sectional representations of the semiconductor device structure along lines AA' and BB' shown in FIG. 1K, in accordance with some embodiments of the disclosure.

FIG. 2G' shows a cross-sectional representation of a semiconductor device structure, in accordance with some embodiments of the disclosure.

FIGS. 3A-3D show top-view representations of various stages of forming the semiconductor device structure, in accordance with some embodiments of the disclosure.

FIG. 4G' shows a cross-sectional representation of a semiconductor device structure, in accordance with some embodiments of the disclosure.

FIG. 5G' shows a cross-sectional representation of a semiconductor device structure, in accordance with some embodiments of the disclosure.

DETAILED DESCRIPTION

Figure 1A:
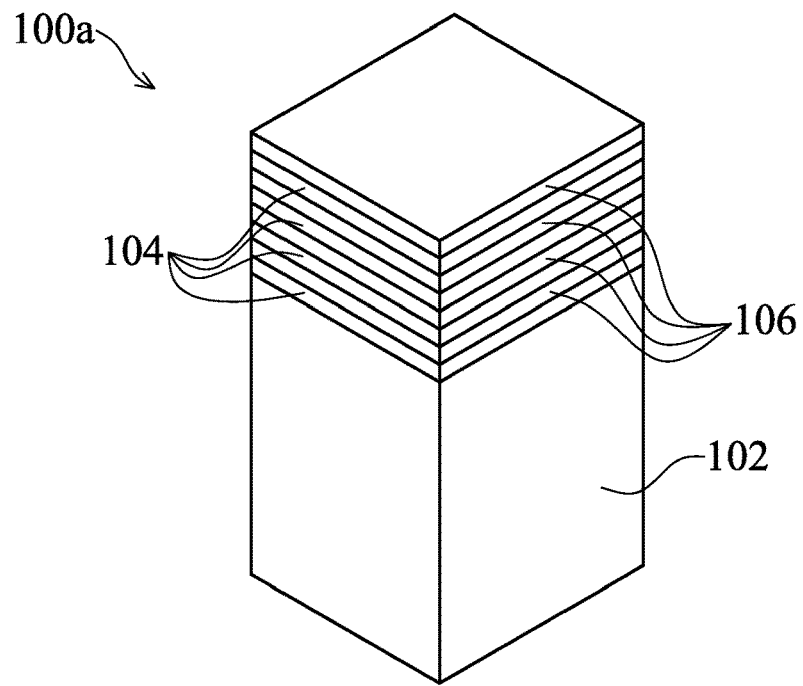
FIGS. 1A-1K show perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. FIGS. 1A-1K show perspective representations of various stages of forming a semiconductor device structure 100a, in accordance with some embodiments of the disclosure. The semiconductor device structure 100a is a gate all around (GAA) transistor structure.

As shown in FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 104 and a number of second semiconductor layers 106 are sequentially alternately formed over the substrate 102. The semiconductor layers 104 and 106 are vertically stacked to form a stacked nanostructures (or stacked nanowires). It should be noted that although four layers of the first semiconductor layers 104 and four layers of the second semiconductor layers 106 are formed, the number of the first semiconductor layers 104 and the second semiconductor layers 106 can be adjusted according to the actual application.

In some embodiments, the first semiconductor layers 104 and the second semiconductor layers 106 independently include silicon (Si), germanium (Ge), silicon germanium ($Si_{1-x}Ge_x$, $0.1<x<0.7$, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 104 and the second semiconductor layer 106 are made of different materials.

The first semiconductor layers 104 and the second semiconductor layers 106 are made of different materials having different lattice constant. In some embodiments, the first semiconductor layer 104 is made of silicon (Si), and the second semiconductor layer 106 is made of silicon germanium ($Si_{1-x}Ge_x$, $0.1<x<0.7$). In some other embodiments, the first semiconductor layer 104 is made of silicon germanium ($Si_{1-x}Ge_x$, $0.1<x<0.7$), and the second semiconductor layer 106 is made of silicon (Si).

In some embodiments, the first semiconductor layers 104 and the second semiconductor layers 106 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 104 and the second semiconductor layers 106 are formed in-situ in the same chamber.

In some embodiments, the thickness of each of the first semiconductor layers 104 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 104 are substantially uniform in thickness. In some embodiments, the thickness of each of the second semiconductor layers 106 is in a range from about 1.5 nm to about 20 nm. In some embodiments, the second semiconductor layers 106 are substantially uniform in thickness.

Figure 1B:
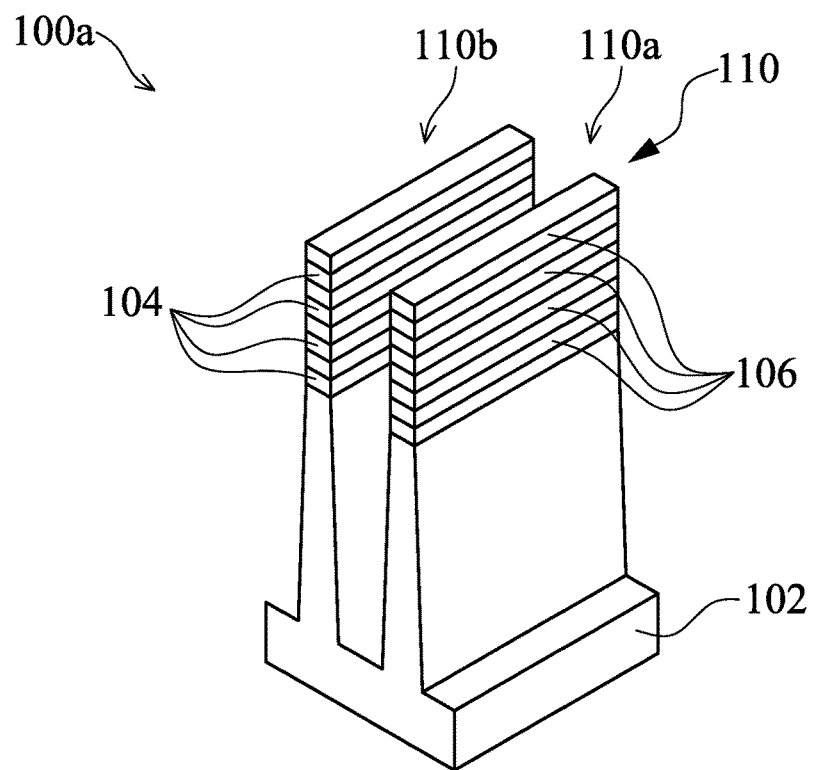

Afterwards, as shown in FIG. 1B, the first semiconductor layers 104 and the second semiconductor layers 106 are patterned to form a fin structure 110, in accordance with some embodiments of the disclosure. The fin structure 110 includes a first fin structure 110a and a second fin structure 110b. The fin structure 110 is formed by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1C:
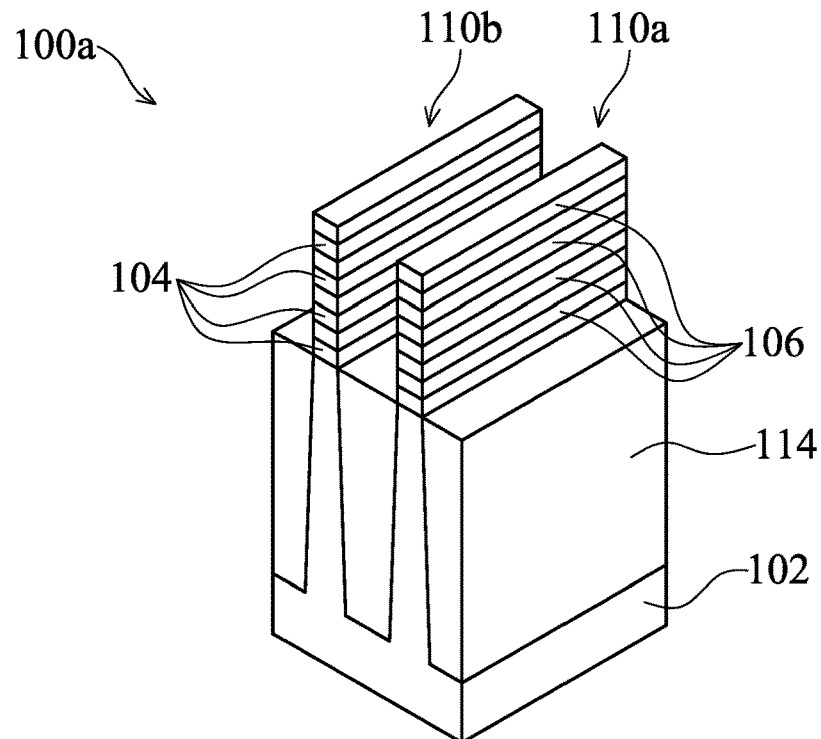

Next, as shown in FIG. 1C, an isolation structure 114 is formed over the substrate 102, in accordance with some embodiments of the disclosure. The top portions of the fin structures 110 are above the isolation structure 114.

An insulating material is formed over the substrate 110 and over the fin structure 110. Next, a portion of the insulating material is removed to form the isolation structure 114. In some embodiments, the insulating material is made of silicon oxide, silicon nitride, silicon oxynitride (SiON), another applicable insulating material, or a combination thereof. In some embodiments, the insulating material is formed by a LPCVD process, plasma enhanced CVD (PECVD) process, high density plasma CVD (HDP-CVD) process, high aspect ratio process (HARP) process, flowable CVD (FCVD) process, atomic layer deposition (ALD) process, another suitable method, or a combination thereof.

Figure 1D:
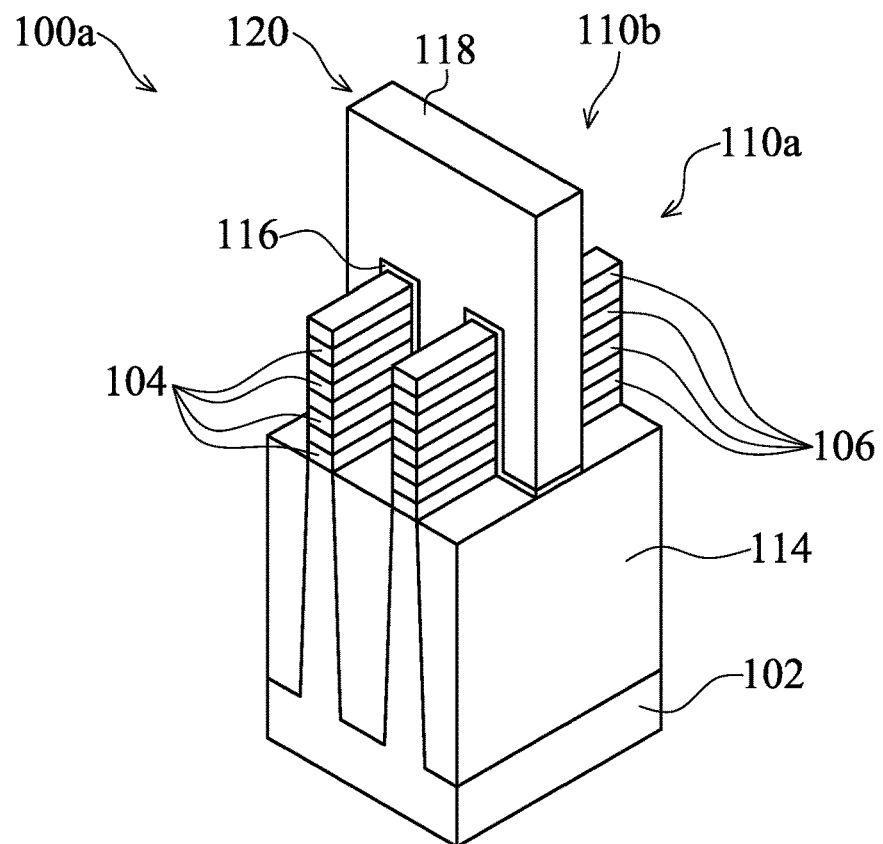

Afterwards, as shown in FIG. 1D, a dummy gate dielectric layer 116 is formed over the fin structure 110, and then a dummy gate electrode layer 118 is formed on the dummy gate dielectric layer 116, in accordance with some embodiments of the disclosure. Afterwards, the dummy gate dielectric layer 116 and the dummy gate electrode layer 118 are patterned by a patterning process to form a dummy gate structure 120.

In some embodiments, the dummy gate dielectric layer 116 includes silicon dioxide, silicon nitride, a high-k dielectric material or another suitable material. In some embodiments, the dummy gate dielectric layer 116 is deposited by an ALD process, a CVD process, a subatmospheric CVD (SACVD) process, a flowable CVD process, a PVD process, or another suitable process.

The dummy gate electrode layer 118 is formed to partially cover and to extend across the fin structure 110. In some embodiments, the dummy gate electrode layer 118 wraps around the fin structure 110. The dummy gate dielectric layers 116 may be made of or include silicon oxide. In some embodiments, the dummy gate electrode layer 118 is made of polycrystalline-silicon (poly-Si) or poly-crystalline silicon-germanium (poly-SiGe).

Figure 1E:
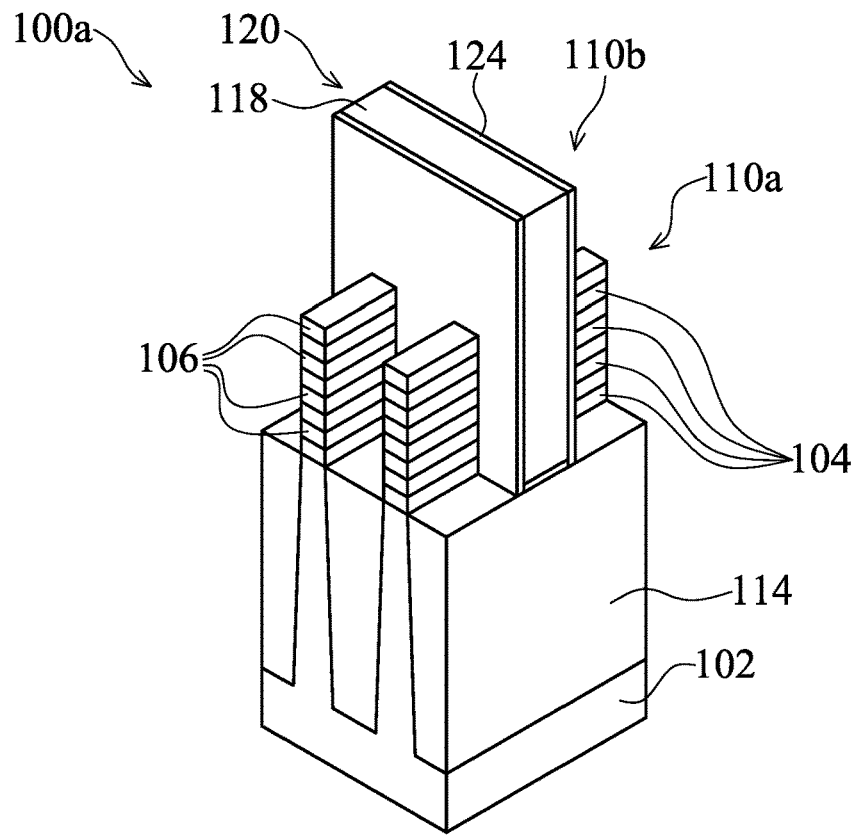

Afterwards, as shown in FIG. 1E, a gate spacer layer 124 is formed on opposite sidewall surfaces of the dummy gate electrode layer 118 and over the dummy gate dielectric layer 116, in accordance with some embodiments. The gate spacer layer 124 can provide more protection to the dummy gate structure 120 during subsequent processes.

In some embodiments, the gate spacer layer 124 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the gate spacer layer 124 is formed by a deposition process, such as CVD process, ALD process, another applicable process, or a combination thereof.

Figure 1F:
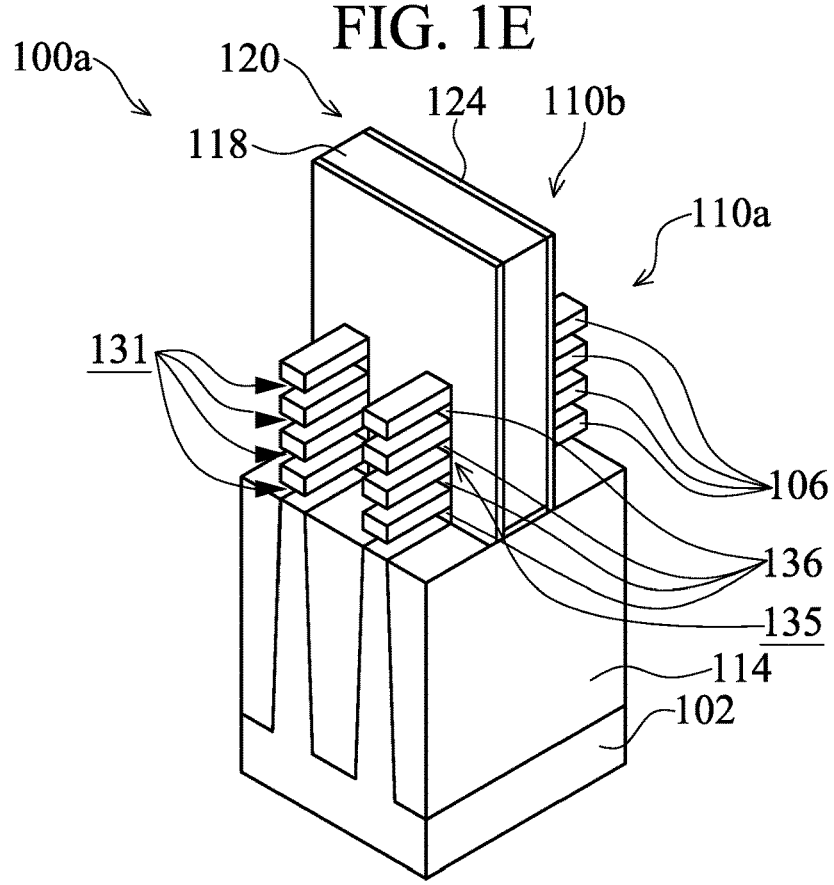

Next, as shown in FIG. 1F, a portion of the fin structure 110 is removed to form a source/drain (S/D) trench 131, in accordance with some embodiments of the disclosure. In some embodiments, a portion of the first semiconductor layers 104 is removed to form the S/D trench 131, and a portion of the second semiconductor layers 106 is exposed. In addition, another portion of the first semiconductor layers 104 directly underlying the gate spacer layer 124 is removed to form a number of cavities 135. The cavities 135 are used to provide a space for forming the inner spacer layer 136. The cavities 135 are directly below the gate spacer layer 124.

Afterwards, an inner spacer material is conformally formed on the S/D trench 131 and the cavities 135, and a portion of the inner spacer material outside of the cavities 135 is removed to form the inner spacer layer 136. The inner spacer layer 136 is configured to as a barrier between an S/D structure 138 (formed later, FIG. 1G) and a first gate structure 170a or a second gate structure 170b (formed later, as shown in FIG. 1K-2). The inner spacer layer 136 can reduce the parasitic capacitance between the S/D structure 138 (formed later, FIG. 1G) and the first gate structure 170a (formed later, as shown in FIG. 1K-2).

The inner spacer layer 136 is directly below the gate spacer layer 124. In some embodiments, the inner spacer layer 136 is made of silicon carbon nitride (SiCN), silicon carbide (SiC), silicon oxycarbide (SiOC), silicon oxide carbonitride (SiOCN), or a combination thereof. In some embodiments, the inner spacer layer 136 is formed by a deposition process, such as CVD process, ALD process, another applicable process, or a combination thereof.

Figure 1G:
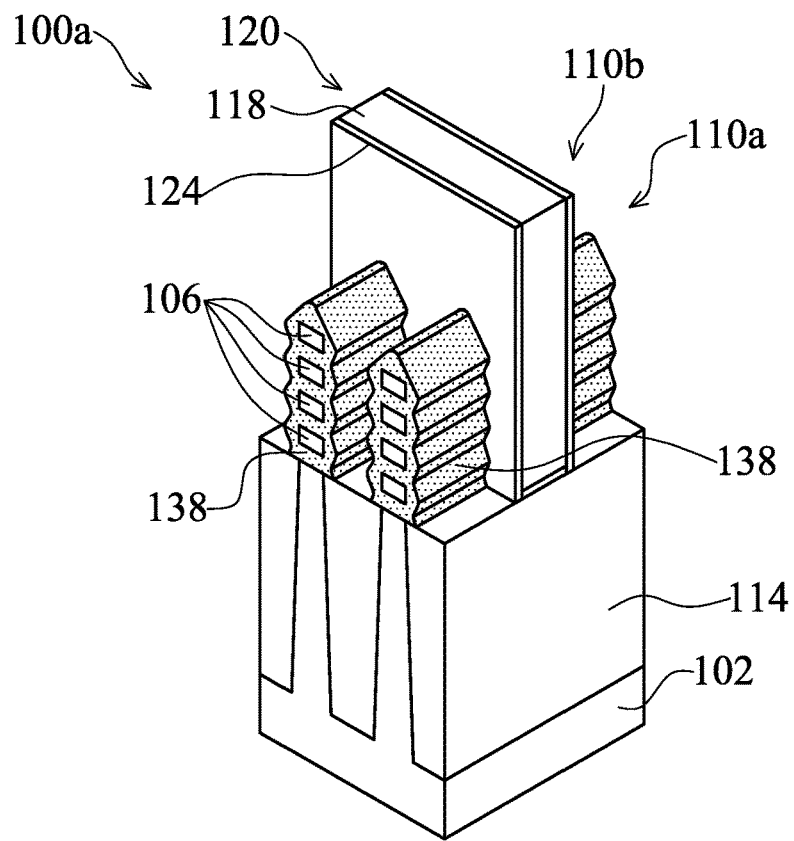

Afterwards, as shown in FIG. 1G, a source/drain (S/D) structure 138 is formed in the S/D trench 129, in accordance with some embodiments of the disclosure. The S/D structure 138 is formed on the exposed second semiconductor layers 106.

The S/D structure 138 is in direct contact with the inner spacer layer 136. The S/D structure 138 may include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The S/D structure 138 may doped with one or more dopants. In some embodiments, the S/D structure 138 is silicon (Si) doped with phosphorus (P), arsenic (As), antimony (Sb), or another applicable dopant. Alternatively, the S/D structure 138 is silicon germanium (SiGe) doped with boron (B) or another applicable dopant.

In some embodiments, the S/D structure 138 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 1H:
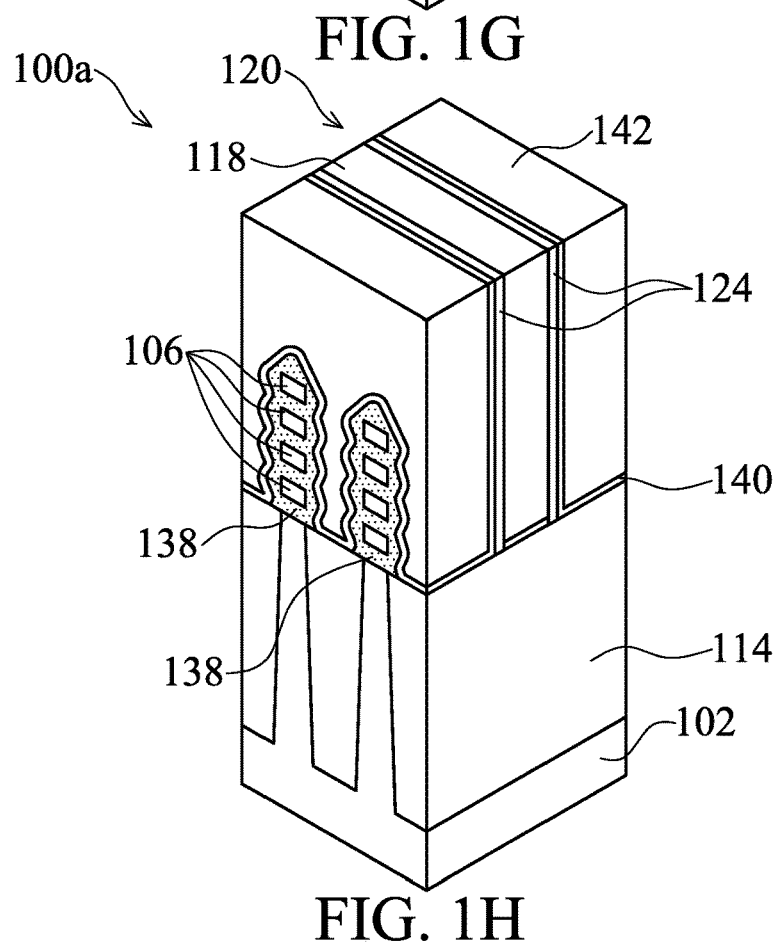

Afterwards, as shown in FIG. 1H, a contact etch stop layer (CESL) 140 is formed over the S/D structures 138, and an inter-layer dielectric (ILD) layer 142 is formed over the CESL 140, in accordance with some embodiments.

Next, a portion of the ILD layer 142 is removed to expose the top surface of the dummy gate electrode layer 118. In some embodiments, the portion of the ILD layer 142 is removed by a planarizing process, a chemical mechanical polishing (CMP) process.

In some embodiments, the CESL 140 is made of silicon nitride, silicon oxynitride, and/or other applicable materials. The CESL 140 may be formed by plasma enhanced chemical vapor deposition (CVD) process, low pressure CVD process, atomic layer deposition (ALD) process, or another applicable processes.

The ILD layer 142 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 142 may be formed by chemical vapor deposition (CVD), physical vapor deposition, (PVD), atomic layer deposition (ALD), spin-on coating, or other applicable processes.

Figure 1I:
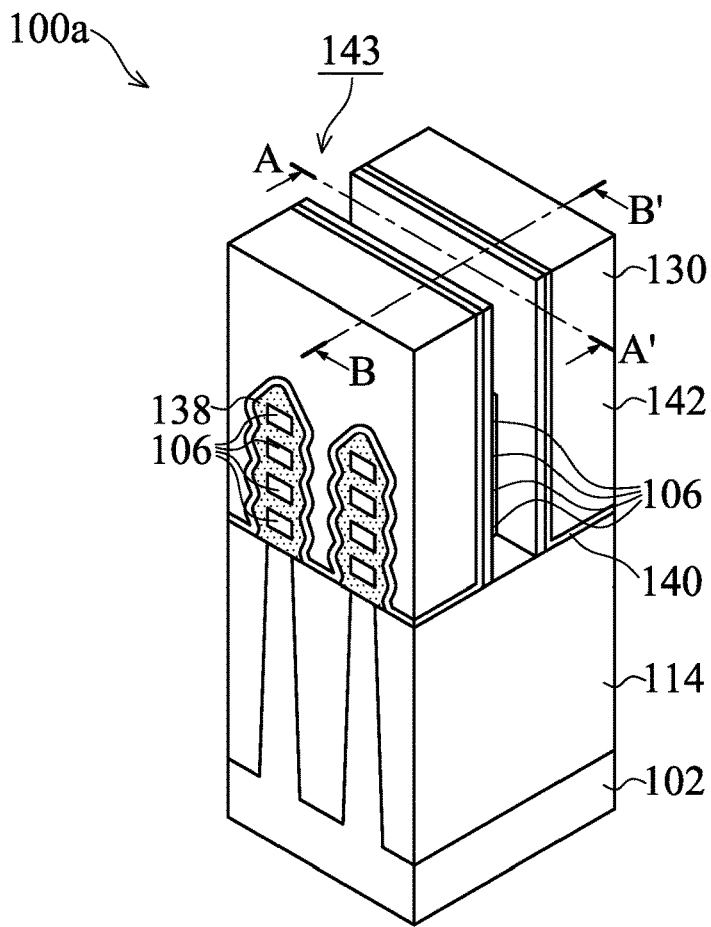
Figures 1, 1I, 2:
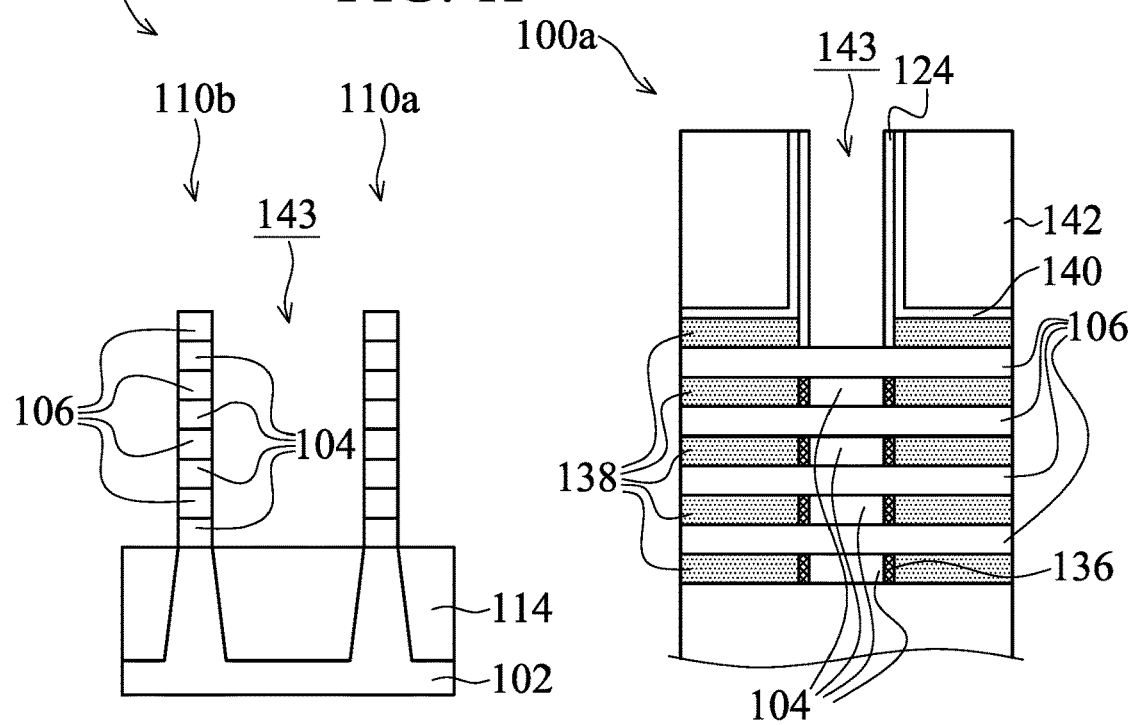

Next, as shown in FIG. 1I, the dummy gate electrode layer 118 and the dummy gate dielectric layer 116 are removed to form a trench 143, in accordance with some embodiments. As a result, the sidewall surfaces of the gate spacer layer 124 are exposed. In some embodiments, the dummy gate electrode layer 118 and the dummy gate dielectric layer 116 are removed by an etching process, such as wet etching process, a dry etching process or a combination thereof.

FIG. 1I-1 shows a cross-sectional representation of the semiconductor device structure 100a along line AA' shown in FIG. 1I, in accordance with some embodiments of the disclosure. As shown in FIG. 1I-1, the first fin structure 110a and the second fin structure 110b are exposed by the trench 143.

FIG. 1I-2 shows a cross-sectional representation of the semiconductor device structure 100a along line BB' shown in FIG. 1I, in accordance with some embodiments of the disclosure. As shown in FIG. 1I-2, the inner spacer layer 136 is formed between the first semiconductor layer 104 and the S/D structure 138. The inner spacer layer 136 is directly below the gate spacer layer 124.

Figure 1J:
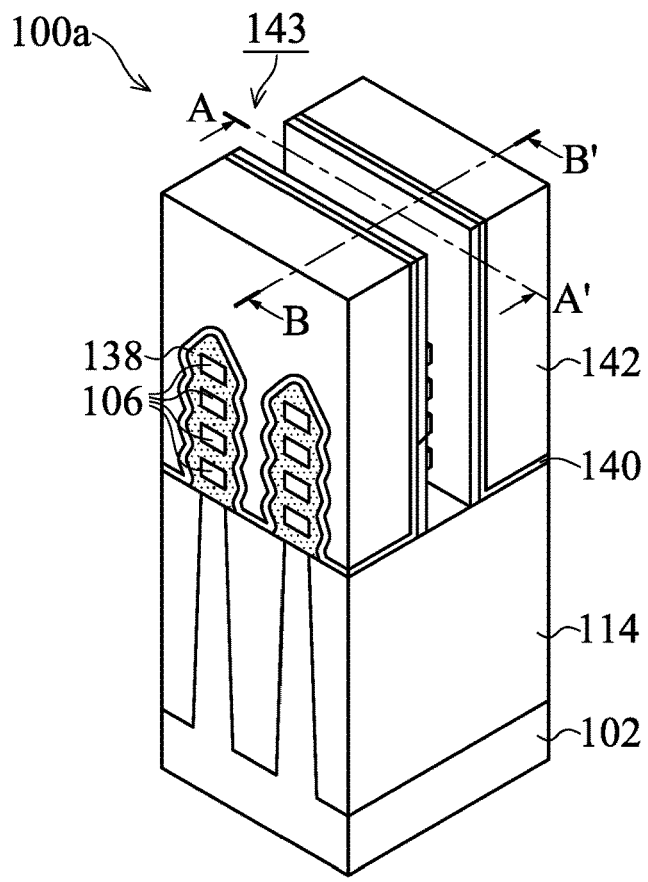
Figures 1, 1J:
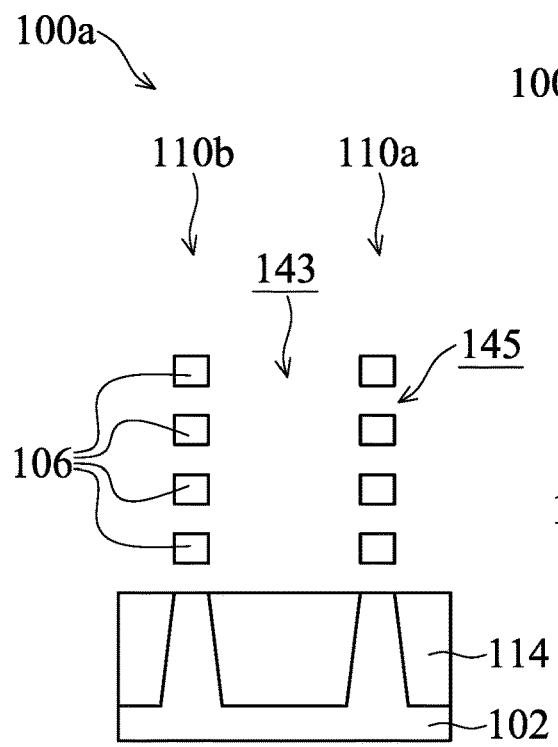
Figures 1, 1J, 2:
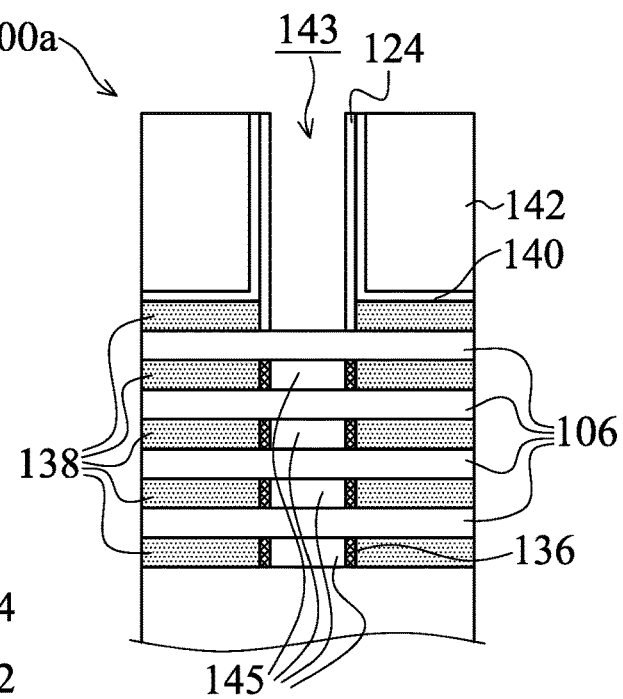
Figure 1K:
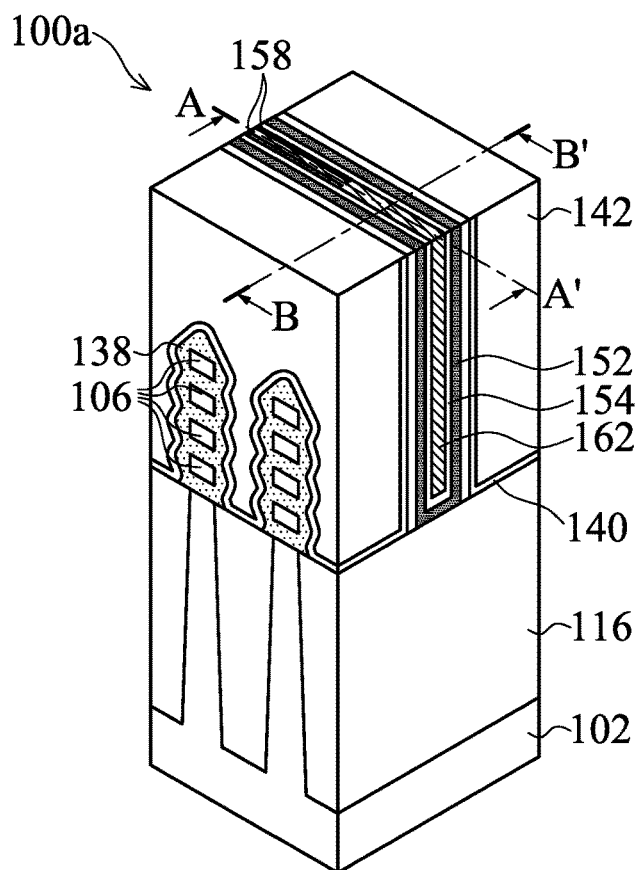
Figures 1, 1K:
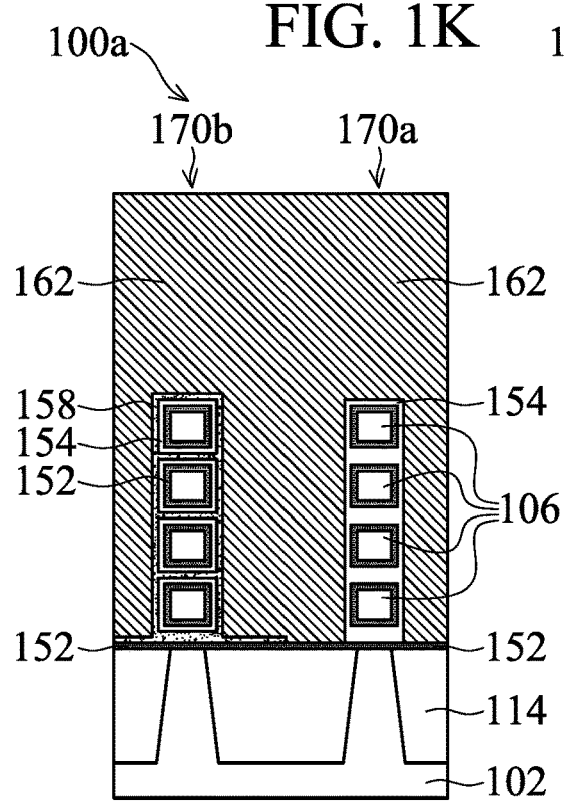
Figures 1, 1K, 2:
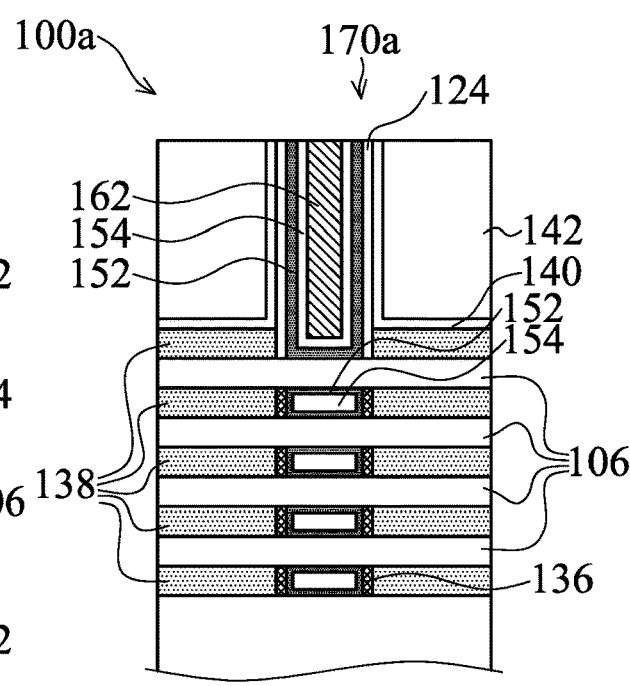

Next, as shown in FIG. 1J, the first semiconductor layers 104 are removed to form a number of gaps 145, in accordance with some embodiments. Each of the gaps 151 is formed between two adjacent second semiconductor layers 106. Since the first semiconductor layers 104 and the second semiconductor layers 106 are made of different materials, they have different etching selectivity. Therefore, the first semiconductor layers 104 are removed, but the second semiconductor layers 106 are left.

The remaining second semiconductor layers 106 are used to as channel region of the semiconductor device structure 100a. In some embodiments, the second semiconductor layers 106 may be referred to as "nanostructures", "nanowires", or "nanosheets". Therefore, the first fin structure 110a includes a number of nanostructures stacked in a vertical direction, and the second fin structure 110b a number of nanostructures stacked in a vertical direction.

FIG. 1J-1 shows a cross-sectional representation of the semiconductor device structure 100a along line AA' shown in FIG. 1J, in accordance with some embodiments of the disclosure. As shown in FIG. 1J-1, the gaps 145 are between two adjacent second semiconductor layers 106, and the gaps 145 are exposed by the trench 143.

FIG. 1J-2 shows a cross-sectional representation of the semiconductor device structure 100a along line BB' shown in FIG. 1J, in accordance with some embodiments of the disclosure. As shown in FIG. 1J-2, the inner spacer layer 136 is between the gap 145 and the S/D structure 138.

Afterwards, as shown in FIG. 1K, a first gate structure 170a and a second gate structure 170b are formed in the trench 143 and gaps 145, in accordance with some embodiments of the disclosure. The first gate structure 170a is formed over the first fin structure 110a, and the second gate structure 170b is formed over the second fin structure 110b.

FIG. 1K-1 shows a cross-sectional representation of the semiconductor device structure 100a along line BB' shown in FIG. 1K, in accordance with some embodiments of the disclosure. FIG. 1K-2 shows a cross-sectional representation of the semiconductor device structure 100a along line AA' shown in FIG. 1K, in accordance with some embodiments of the disclosure.

As shown in FIGS. 1K-1 and 1K-2, each of the second semiconductor layers 106 is surrounded by the multiple layers of the first gate structure 170a and the multiple layers of the second gate structure 170b. The first gate structure 170a includes three layers with three different materials, and second gate structure 170b includes four layers with four different materials. In some embodiments, the first gate structure 170a includes a gate dielectric layer 152, a n-work function layer 154 and a filling layer 162. The second gate structure 170b includes the gate dielectric layer 152, a n-work function layer 154, a p-work function layer 158 and the filling layer 162. In some embodiments, the n-work function layer 154 includes one or more layers. In some embodiments, the p-work function layer 158 includes one or more layers. In other words, each of the nanostructures 106 is surrounded by the gate dielectric layer 152, the n-work function layer 154, and the filling layer 162.

In some embodiments, the gate dielectric layer 152 is a high-k dielectric layer. In some embodiments, the high-k gate dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layer 152 is formed using chemical vapor deposition (CVD), atomic layer deposition (ALD), another suitable method, or a combination thereof.

In some embodiments, the n-work function layer 154 includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the n-work function layer 154 is formed using chemical vapor deposition (CVD), atomic layer deposition (ALD), another suitable method, or a combination thereof.

In some embodiments, the p-work function layer 158 includes titanium (Ti), titanium nitride (TiN), tantalum nitride (TaN), tantalum carbide (TaC), molybdenum nitride, tungsten nitride (WN), ruthenium (Ru) or a combination thereof. In some embodiments, the p-work function layer 158 is formed using chemical vapor deposition (CVD), atomic layer deposition (ALD), another suitable method, or a combination thereof.

In some embodiments, the filling layer 162 includes aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the filling layer 162 is formed using CVD, ALD, electroplating, another suitable method, or a combination thereof.

Figure 2A:
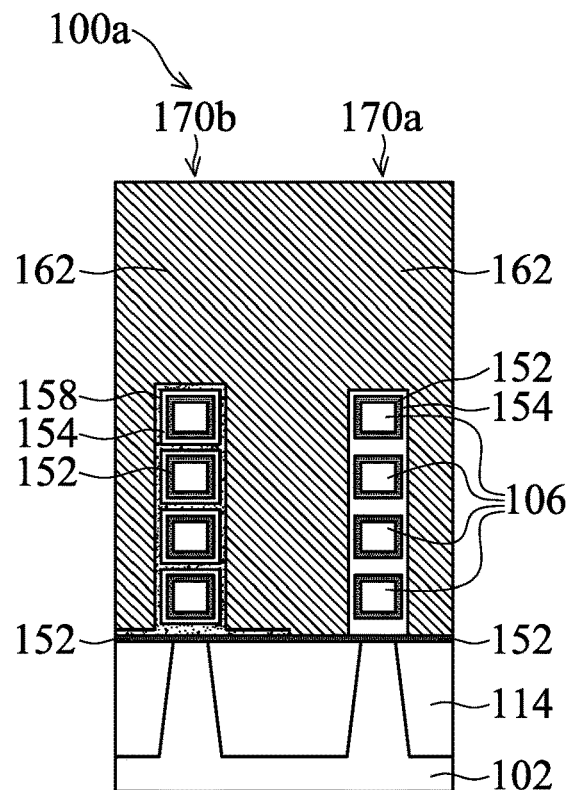
FIGS. 2A-2G show cross-sectional representations of various stages of forming the semiconductor device structure after FIG. 1J-1, in accordance with some embodiments of the disclosure.

FIGS. 2A-2G show cross-sectional representations of various stages of forming the semiconductor device structure 100a after FIG. 1J-1, in accordance with some embodiments of the disclosure. FIG. 2A shows a cross-sectional representation of the semiconductor device structure along line AA' shown in FIG. 1K, in accordance with some embodiments. FIG. 2A-2G show a metal cut process to divide the gate structure into two portions.

As shown in FIG. 2A, the first gate structure 170a and the second gate structure 170b are formed, in accordance with some embodiments. The first gate structure 170a includes three layers, and second gate structure 170b includes four layers.

Figure 2B:
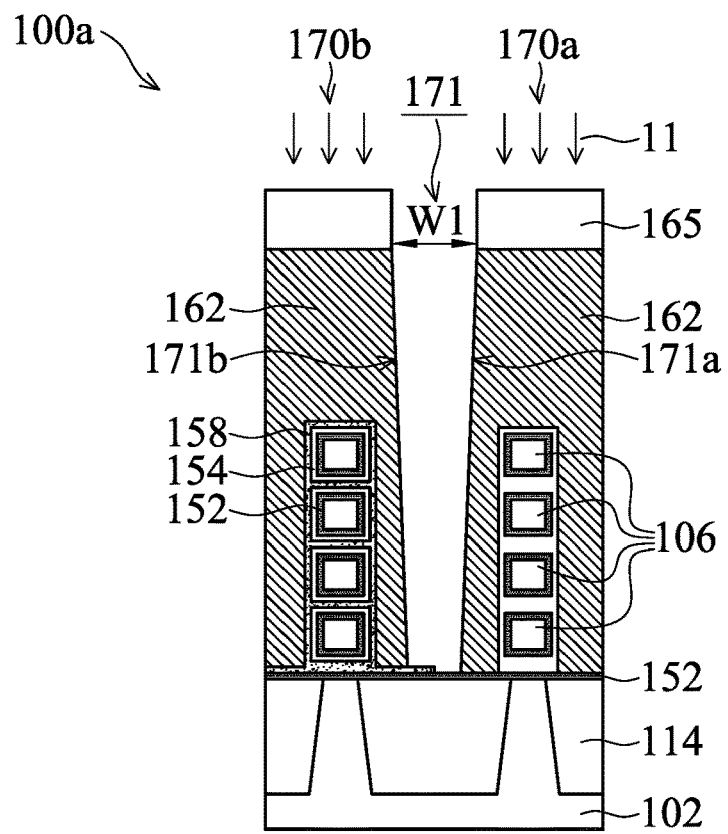

Next, as shown in FIG. 2B, a mask layer 165 is formed over the first gate structure 170a and the second gate structure 170b, and then the mask layer 165 is patterned to form the patterned mask layer 165, in accordance with some embodiments. Next, a portion of the filling layer 162 is removed to form an opening 171 by using the patterned mask layer 165 as the mask. As a result, the p-work function layer 158 is exposed by the opening 171. In some embodiments, the portion of the filling layer 162 is removed by a first etching process 11.

In some embodiments, the first etching process 11 is operated by using an etchant, and the etchant includes $Cl_2$, HBr, $BCl_3$, $NF_3$ or $N_2$ or a combination thereof. In some embodiments, the first etching process 11 is operated at a pressure in a range from about 1 mtorr to about 40 mtorr. In some embodiments, the first etching process 11 is operated at a power in a range from about 100 W to about 700 W. In some embodiments, the first etching process 11 is operated at a temperature in a range from about 10 Celsius degrees to about 50 Celsius degrees.

The opening 171 has a tapered width from top to bottom. The opening 171 has a first width $W_1$. In some embodiments, the first width $W_1$ of the opening 171 is in a range from about 5 nm to about 10 nm.

Figure 2C:
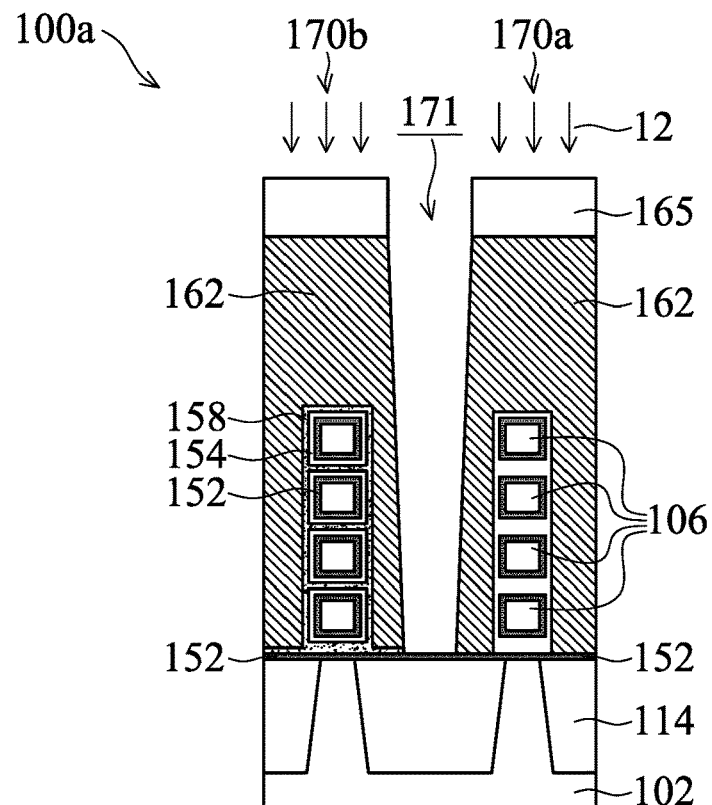

Afterwards, as shown in FIG. 2C, a portion of the p-work function layer 158 is removed, in accordance with some embodiments. In some embodiments, the portion of p-work function layer 158 is removed by a second etching process 12. It should be noted that the gate dielectric layer 152 is not removed by the second etching process 12.

In some embodiments, the second etching process 12 is operated by using an etchant, and the etchant includes $Cl_2$, HBr, $BCl_3$, $NF_3$, $N_2$, $CF_4$, $CH_2F_2$, or a combination thereof. In some embodiments, the second etching process 12 is operated at a pressure in a range from about 1 mtorr to about 40 mtorr. In some embodiments, the second etching process 12 is operated at a power in a range from about 100 W to about 1000 W. In some embodiments, the second etching process 12 is operated at a temperature in a range from about 10 Celsius degrees to about 50 Celsius degrees.

Figure 2D:
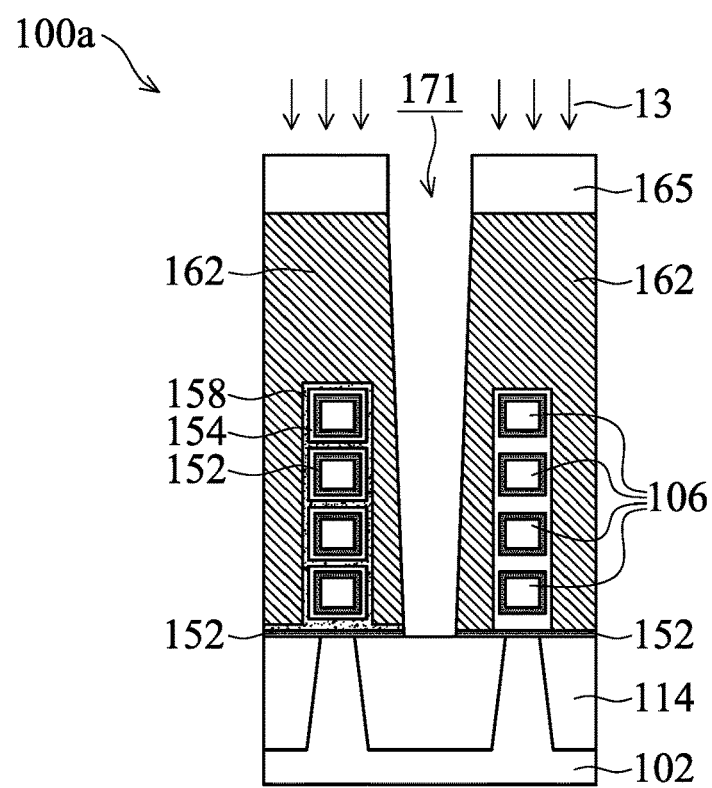

Afterwards, as shown in FIG. 2D, a portion of the gate dielectric layer 152 is removed to expose a top surface of the isolation structure 114, in accordance with some embodiments. In some embodiments, the portion of the gate dielectric layer 152 is removed by a third etching process 13.

In some embodiments, the third etching process 13 is operated by using an etchant, and the etchant includes $Cl_2$, $BCl_3$, $N_2$, $CF_4$, $CHF_3$, $N_2H_2$, $O_2$, or a combination thereof. In some embodiments, the third etching process 13 is operated at a pressure in a range from about 1 mtorr to about 40 mtorr. In some embodiments, the third etching process 13 is operated at a power in a range from about 100 W to about 1000 W. In some embodiments, the third etching process 13 is operated at a temperature in a range from about 10 Celsius degrees to about 50 Celsius degrees.

Figure 2E:
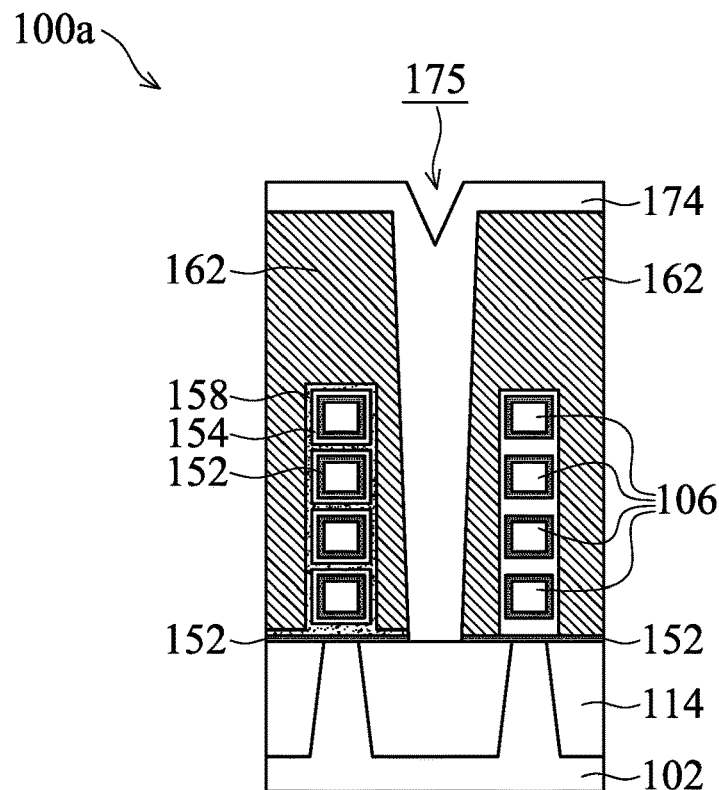

Afterwards, as shown in FIG. 2E, the mask layer 165 is removed, and a first isolation sealing layer 174 is formed in the opening 171, in accordance with some embodiments. In some embodiments, the mask layer 165 is removed by an etching process, and the etching process is similar to the third etching process 13.

The first isolation sealing layer 174 is conformally formed in the opening 171, and a void 175 is formed in the first isolation sealing layer 174. In some embodiments, the first isolation sealing layer 174 and the ILD layer 142 are made of different materials.

In some embodiments, after the mask layer 165 is removed, a cleaning process is performed to remove some unwanted residue, such as some by-products. In some embodiments, the cleaning process includes a wet etching process. In some embodiments, the wet cleaning process includes using diluted HF solution. The wet cleaning process is operated at a temperature in a range from 30 Celsius degrees to about 60 Celsius degrees.

In some embodiments, the first isolation sealing layer 174 includes a high-k dielectric layer. In some embodiments, the high-k dielectric layer is made of one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the first isolation sealing layer 174 is formed by using chemical vapor deposition (CVD), atomic layer deposition (ALD), another suitable method, or a combination thereof.

Figure 2F:
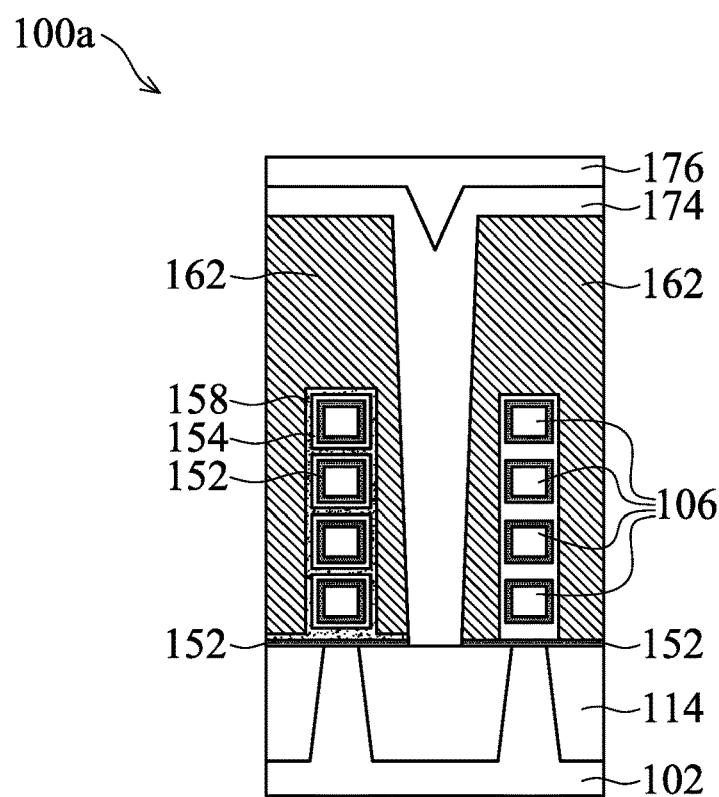

Next, as shown in FIG. 2F, a second isolation sealing layer 176 is formed on the first isolation sealing layer 174, in accordance with some embodiments. The second isolation sealing layer 176 is used to fill the void 175.

In some embodiments, the second isolation sealing layer 176 and the ILD layer 142 are made of different materials. The first isolation sealing layer 174 and the second isolation sealing layer 176 are made of different materials. In some embodiments, the second isolation sealing layer 176 includes nitride, silicon nitride or another applicable material.

Figure 2G:
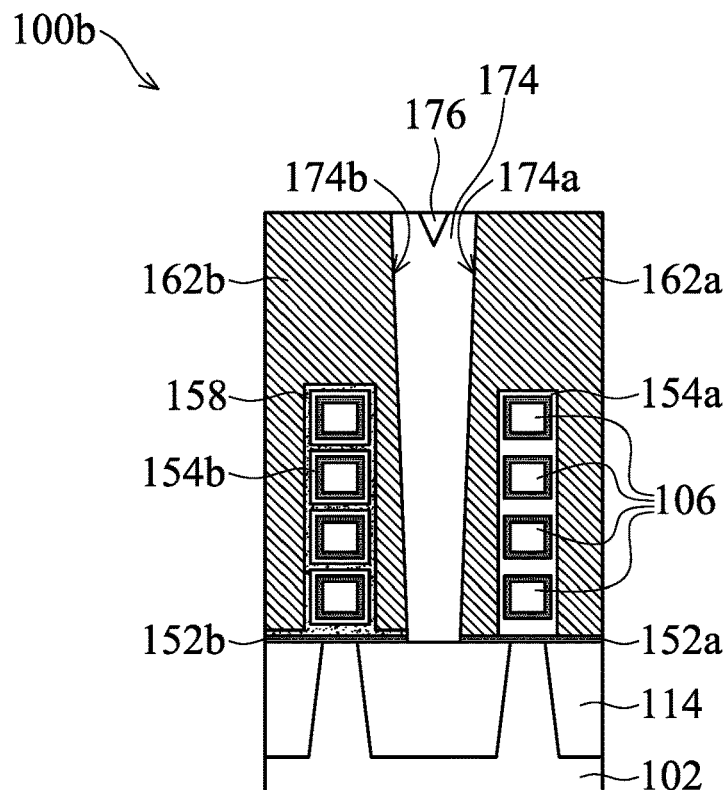
Figure 2G:
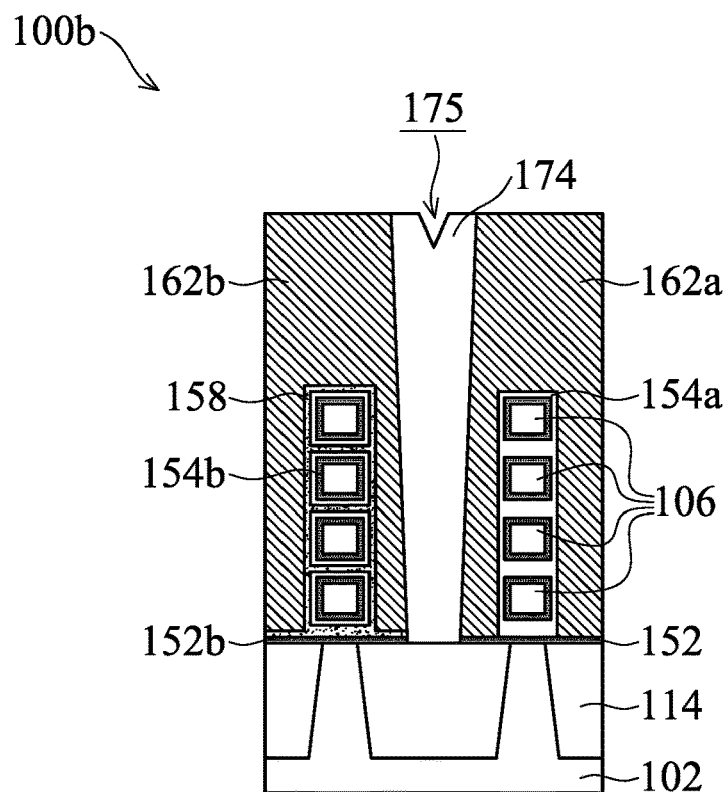

Afterwards, as shown in FIG. 2G, a portion of the first isolation sealing layer 174 and a portion of the second isolation sealing layer 176 are removed, in accordance with some embodiments. As a result, the first isolation sealing layer 174 and the second isolation sealing layer 176 is between the first gate structure 170a and the second gate structure 170b. The first isolation sealing layer 174 is used to divide the gate structure into the first gate structure 170a and the second gate structure 170b. The first gate structure 170a and the second gate structure 170b are separated by the first isolation sealing layer 174 and the second isolation sealing layer 176.

After the first gate structure 170a and the second gate structure 170b are separated, the first gate structure 170a includes a first portion 152a of the gate dielectric layer 152, a first portion 154a of the n-work function layer 154, and a first portion 162a of the filling layer 162, and the second gate structure 170b includes a second portion 152b of the dielectric layer 152, a second portion 154b of the n-work function layer 154, the p-work function layer 158 and a second portion 162b of the filling layer 162.

The first isolation sealing layer 174 is in direct contact with the first portion 152a of the gate dielectric layer 152 and the first portion 162a of the filling layer 162 of the first gate structure 170a. In addition, the first isolation sealing layer 174 is in direct contact with the second portion 152b of the gate dielectric layer 152, the second portion 154b of the n-work function layer 154, the p-work function layer 158 and the second portion 162b of the filling layer 162.

In some embodiments, the first isolation sealing layer 174 has a tapered width from top to bottom. In some embodiments, the first isolation sealing layer 174 has a top surface with a top width and a bottom surface with a bottom width, and the top width is greater than the bottom width. In some embodiments, the bottommost surface of the first portion 162a of the filling layer 162 is lower than the bottommost surface of the second portion 162b of the filling layer 162. In addition, the top surface of a portion of the p-work function layer 158 which is in direct contact with the first isolation sealing layer 174 is higher than the bottommost surface of the first portion 162a of the filling layer 162. In some embodiments, the first isolation sealing layer 174 has a V-shaped structure, and the second isolation sealing layer 176 is in the middle portion of the V-shaped structure.

In some embodiments, the first isolation sealing layer 174 has a first sidewall 174a and a second sidewall 174b, the first sidewall 174a is in direct contact with at least two different materials of the first gate structure 170a, and the second sidewall 174b is in direct contact with at least three different materials of the second gate structure 170b.

In some embodiment, the portion of the first isolation sealing layer 174 and the portion of the second isolation sealing layer 176 are removed by a planarizing process, a chemical mechanical polishing (CMP) process.

FIG. 2G' shows a cross-sectional representation of a semiconductor device structure 100b, in accordance with some embodiments of the disclosure. Some processes and materials used to form the semiconductor device structure 100b are similar to, or the same as, those used to form the semiconductor device structure 100a and are not repeated herein. The semiconductor device structure 100b of FIG. 2G' is similar to the semiconductor device structure 100a of FIG. 2G, the differences between FIG. 2G' and FIG. 2G are that no second isolation sealing layer is formed in the void 175 in FIG. 2G'. Therefore, the first isolation sealing layer 174 has a V-shaped structure, and the void 175 is in the middle portion of the V-shaped structure.

It should be noted that the first isolation sealing layer 174 and the second isolation sealing layer 176 are used as an isolation structure to separate the first gate structure 170a and the second gate structure 170b. In a comparative embodiment, the dummy gate structure (such as poly Si) is removed partially, and then an isolation layer is formed in the dummy gate structure to use as an isolation post. Next, a first gate structure and a second gate structure are formed next to the isolation post. Compared with the comparative embodiment, since in this disclosure, the dummy gate structure is removed completely firstly to form the trench 143, and then the first gate structure 170a and the second gate structure 170b are formed in the trench 143. The first gate structure 170a and the second gate structure 170b have more space (trench 143 and gap 145) for depositing multiple layers. Therefore, the process window is increased and the yield of the semiconductor device structure 100a is improved.

In addition, since the width of the opening 171 for forming the first isolation sealing layer 174 is greater than an opening for forming the isolation post in the comparative embodiment, there are more space for depositing the first isolation sealing layer 174. In addition, the leakage current can be reduced due to the thicker first isolation sealing layer 174.

FIGS. 3A-3D show top-view representations of various stages of forming the semiconductor device structure 100a, in accordance with some embodiments of the disclosure.

FIG. 3A shows a top-view of the semiconductor device structure 100a in FIG. 1E. As shown in FIG. 3A, the dummy gate structure 120 is cross over the first fin structure 110a and the second fin structure 110b. The gate spacer layer 124 is on opposite side of the dummy gate structure 120.

FIG. 3B shows a top-view of the semiconductor device structure 100a in FIG. 1I. As shown in FIG. 3B, the dummy gate structure 120 is removed to form the trench 143. The middle portion of the first fin structure 110a and the middle portion of the second fin structure 110b are exposed by the trench 143.

FIG. 3C shows a top-view of the semiconductor device structure 100a in FIG. 1K. As shown in FIG. 3C, the first gate structure 170a and the second gate structure 170b are formed in the trench 143.

FIG. 3D shows a top-view of the semiconductor device structure 100a in FIG. 2G. As shown in FIG. 3D, the first isolation sealing layer 174 and the second isolation sealing layer 176 are between the first gate structure 170a and the second gate structure 170b. The second isolation sealing layer 176 is in the middle portion of the first isolation sealing layer 174. The top-view of the second isolation sealing layer 176 may have circle, square, rectangle, hexagon, octagon, or other shape.

FIGS. 4A-4G show cross-sectional representations of various stages of forming the semiconductor device structure 100c after FIG. 1J-1, in accordance with some embodiments of the disclosure. Some processes and materials used to form the semiconductor device structure 100c are similar to, or the same as, those used to form the semiconductor device structure 100a and are not repeated herein.

Figure 4A:
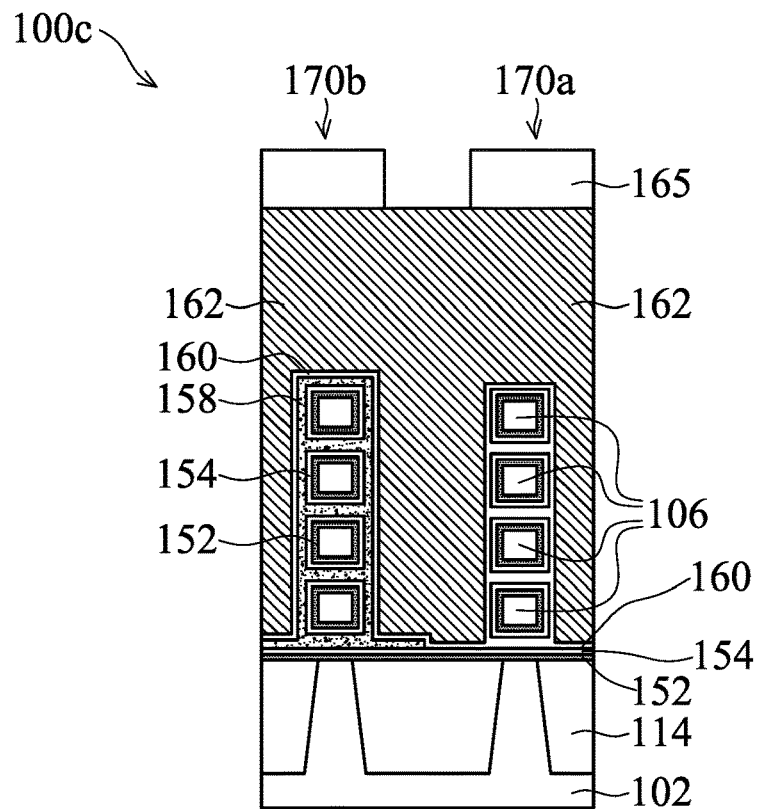
FIGS. 4A-4G show cross-sectional representations of various stages of forming the semiconductor device structure after FIG. 1J-1, in accordance with some embodiments of the disclosure.

The semiconductor device structure 100c of FIG. 4A is similar to the semiconductor device structure 100a of FIG. 2A, the differences between FIG. 4A and FIG. 2A are that additional layer is formed in the first gate structure 170a and the second gate structure 170b in FIG. 4A, and the additional layer is a block layer 160. The block layer 160 is used to prevent moisture from entering the underlying layers.

As shown in FIG. 4A, the first gate structure 170a and the second gate structure 170b are formed, and the mask layer 165 is formed over the firs gate structure 170a and the second gate structure 170b, in accordance with some embodiments of the disclosure.

The first gate structure 170a includes four layers with four different materials, and second gate structure 170b includes five layers with five different materials. The first gate structure 170a includes the gate dielectric layer 152, the n-work function layer 154, a block layer 160, and the filling layer 162. The second gate structure 170b includes the gate dielectric layer 152, the n-work function layer 154, the p-work function layer 158, the block layer 160 and the filling layer 162.

Figure 4B:
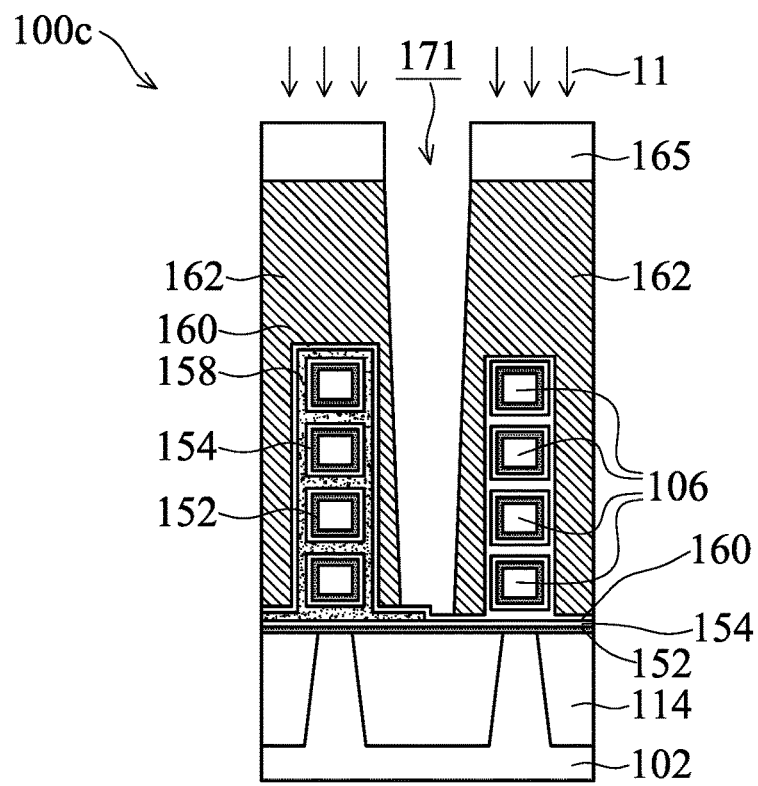

Next, as shown in FIG. 4B, a portion of the filling layer 162 is removed to form an opening 171 by using the patterned mask layer 165 as the mask. As a result, the block layer 160 is exposed by the opening 171. In some embodiments, the portion of the filling layer 162 is removed by the first etching process 11. The process conditions of the first etching process 11 is described above, and thus are omitted for brevity.

Figure 4C:
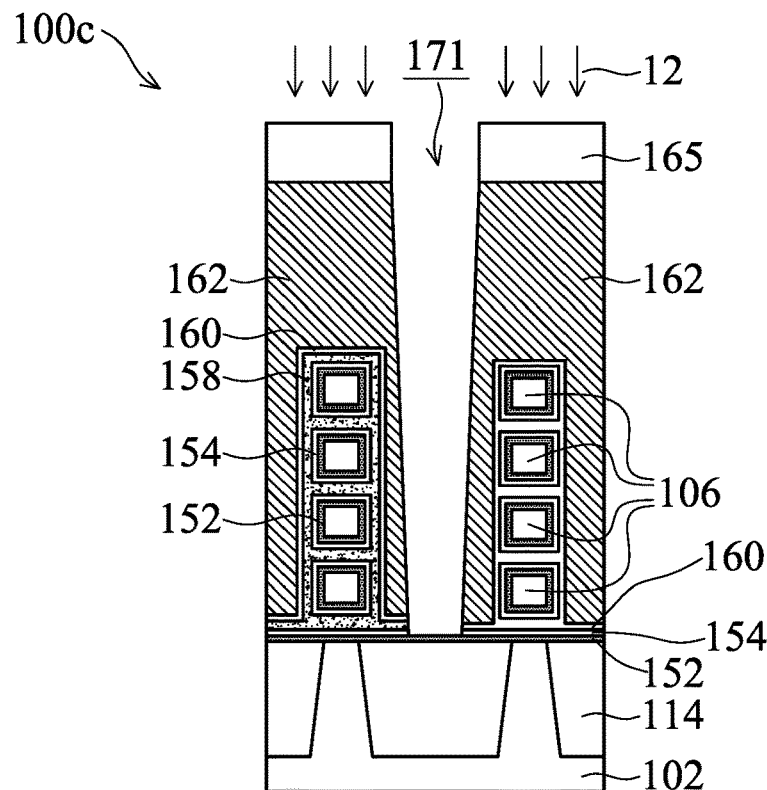

Afterwards, as shown in FIG. 4C, a portion of the block layer 160, a portion of the p-work function layer 158, and a portion of the n-work function layer 154 are removed by the second etching process 12, in accordance with some embodiments. In some embodiments. The process conditions of the second etching process 12 is described above, and thus are omitted for brevity. It should be noted that the gate dielectric layer 152 is not removed by the second etching process 12, and the top surface of the gate dielectric layer 152 is exposed.

Figure 4D:
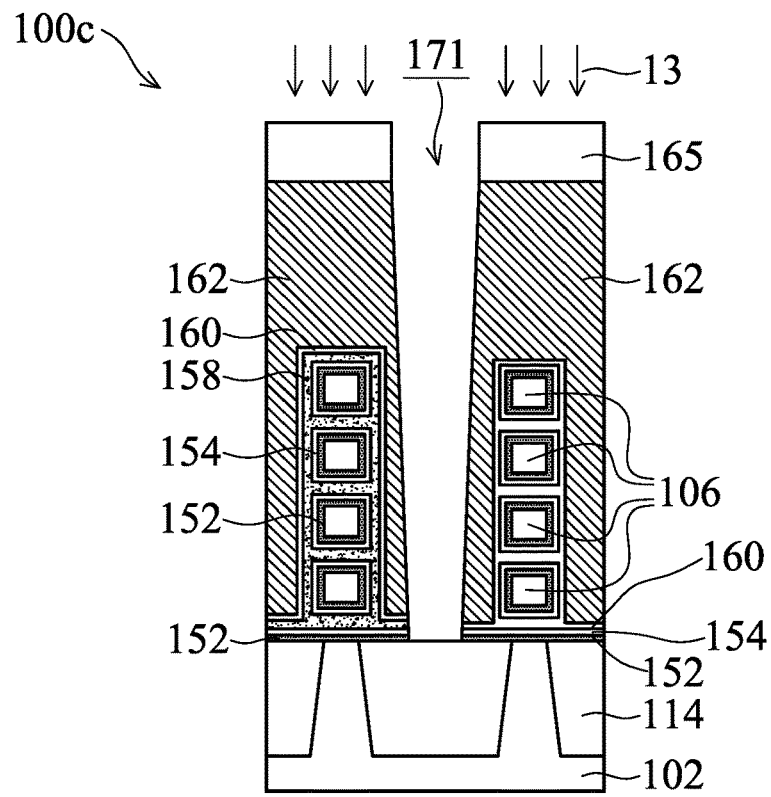

Subsequently, as shown in FIG. 4D, a portion of the gate dielectric layer 152 is removed by the third etching process 13 to expose a top surface of the isolation structure 114, in accordance with some embodiments.

Figure 4E:
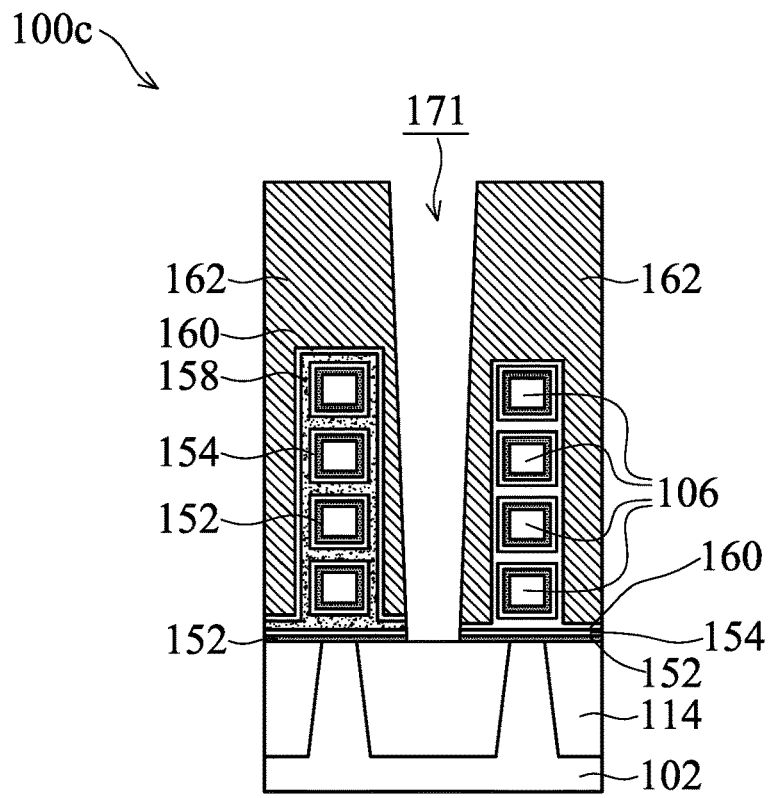

Next, as shown in FIG. 4E, the mask layer 165 is removed, in accordance with some embodiments.

Figure 4F:
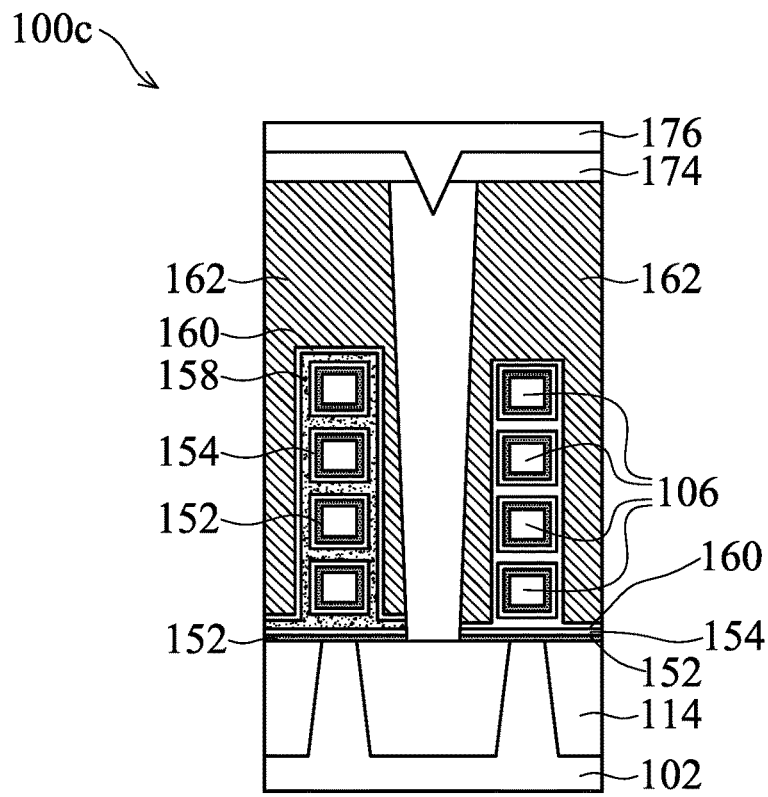

Afterwards, as shown in FIG. 4F, the first isolation sealing layer 174 is formed in the opening 171, and the second isolation sealing layer 176 is formed on the first isolation sealing layer 174, in accordance with some embodiments.

Figure 4G:
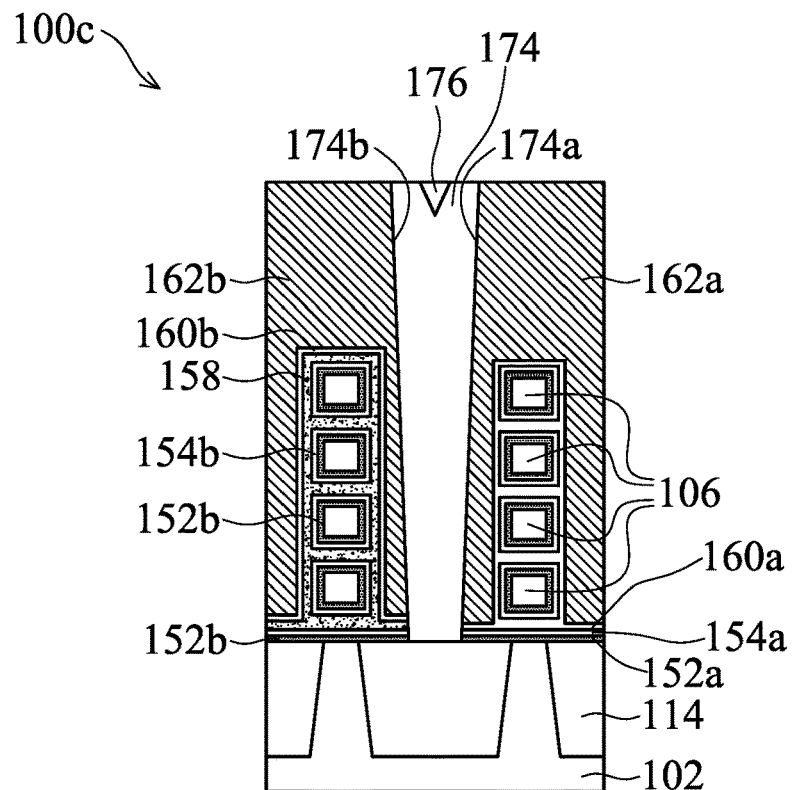
Figure 4G:
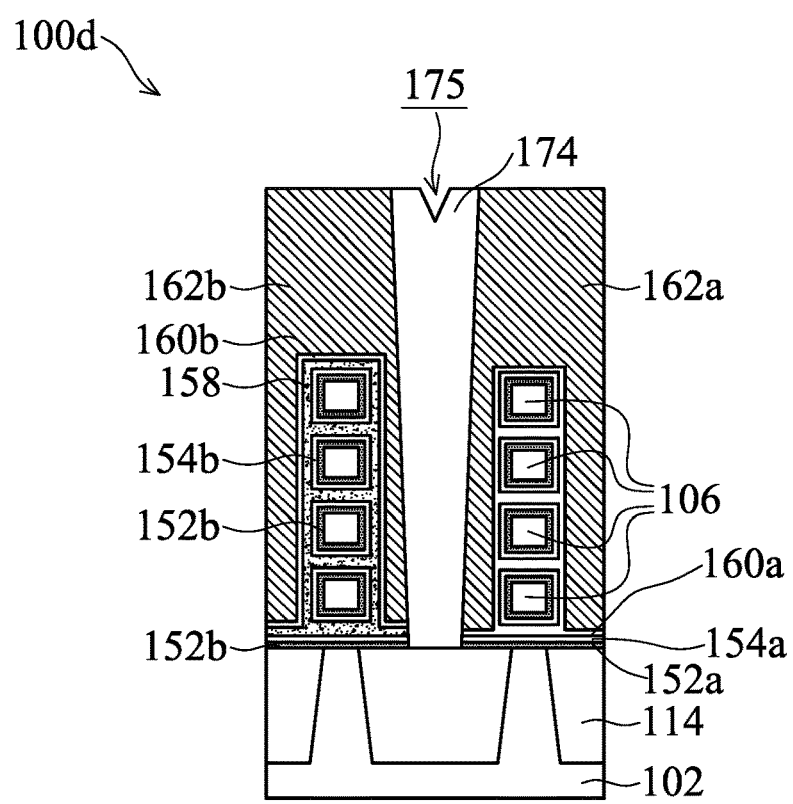

Subsequently, as shown in FIG. 4G, a portion of the first isolation sealing layer 174 and a portion of the second isolation sealing layer 176 are removed, in accordance with some embodiments. In some embodiment, the portion of the first isolation sealing layer 174 and the portion of the second isolation sealing layer 176 are removed by a planarizing process, a chemical mechanical polishing (CMP) process.

FIG. 4G' shows a cross-sectional representation of a semiconductor device structure 100d, in accordance with some embodiments of the disclosure. Some processes and materials used to form the semiconductor device structure 100d are similar to, or the same as, those used to form the semiconductor device structure 100c and are not repeated herein. The semiconductor device structure 100d of FIG. 4G' is similar to the semiconductor device structure 100c of FIG. 4G, the differences between FIG. 4G' and FIG. 4G are that no second isolation sealing layer is formed in the void 175 in FIG. 4G'. As shown in FIG. 4G', the first isolation sealing layer 174 has a V-shaped structure, and the void 175 is in the middle portion of the V-shaped structure.

FIGS. 5A-5G show cross-sectional representations of various stages of forming the semiconductor device structure 100e after FIG. 1J-1, in accordance with some embodiments of the disclosure. Some processes and materials used to form the semiconductor device structure 100e are similar to, or the same as, those used to form the semiconductor device structure 100a and are not repeated herein.

Figure 5A:
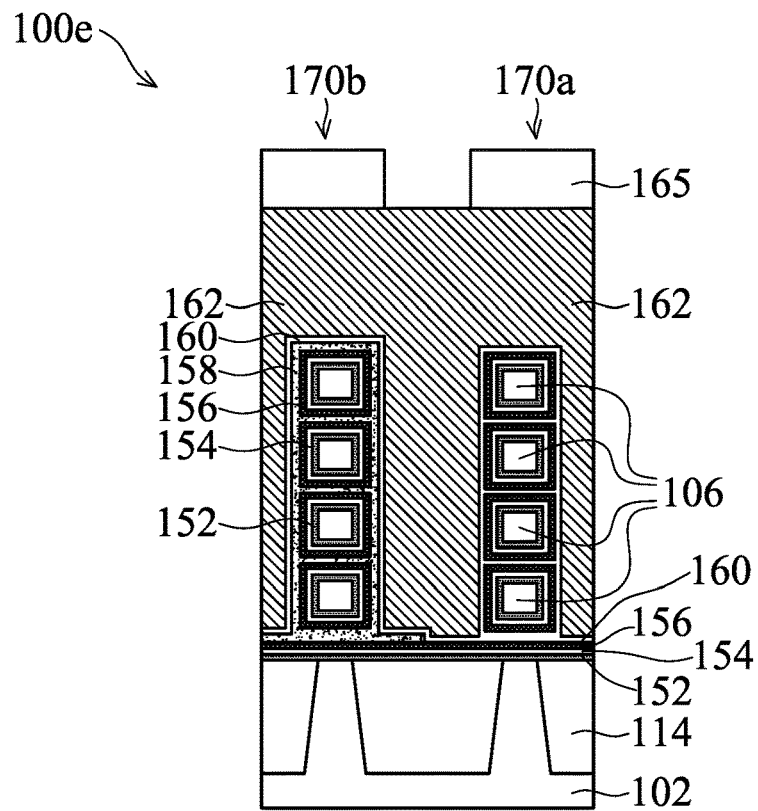
FIGS. 5A-5G show cross-sectional representations of various stages of forming the semiconductor device structure after FIG. 1J-1, in accordance with some embodiments of the disclosure.

The semiconductor device structure 100e of FIG. 5A is similar to the semiconductor device structure 100c of FIG. 4A, the differences between FIG. 5A and FIG. 4A are that additional layer is formed in the first gate structure 170a and the second gate structure 170b in FIG. 5A, and the additional layer is a barrier layer 156. The barrier layer 156 is used to improve the adhesion and prevent metal diffusion. In some embodiments, the barrier layer 156 is increase the adhesion between the n-work function layer 154 and the block layer 160.

As shown in FIG. 5A, the first gate structure 170a and the second gate structure 170b are formed, and the mask layer 165 is formed over the firs gate structure 170a and the second gate structure 170b, in accordance with some embodiments of the disclosure.

The first gate structure 170a includes five layers with five different materials, and second gate structure 170b includes six layers with six different materials. The first gate structure 170a includes the gate dielectric layer 152, the n-work function layer 154, the barrier layer 156, the block layer 160, and the filling layer 162. The second gate structure 170b includes the gate dielectric layer 152, the n-work function layer 154, the barrier layer 156, the p-work function layer 158, the block layer 160 and the filling layer 162.

Figure 5B:
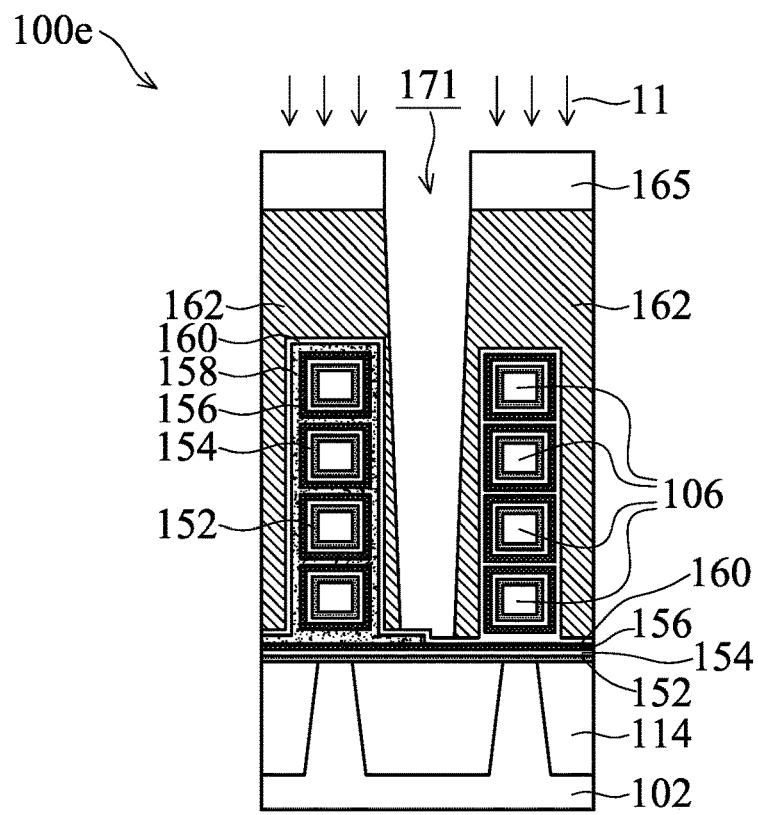

Next, as shown in FIG. 5B, a portion of the filling layer 162 is removed to form the opening 171 by the first etching process 11 using the patterned mask layer 165 as the mask. As a result, the block layer 160 is exposed by the opening 171.

Figure 5C:
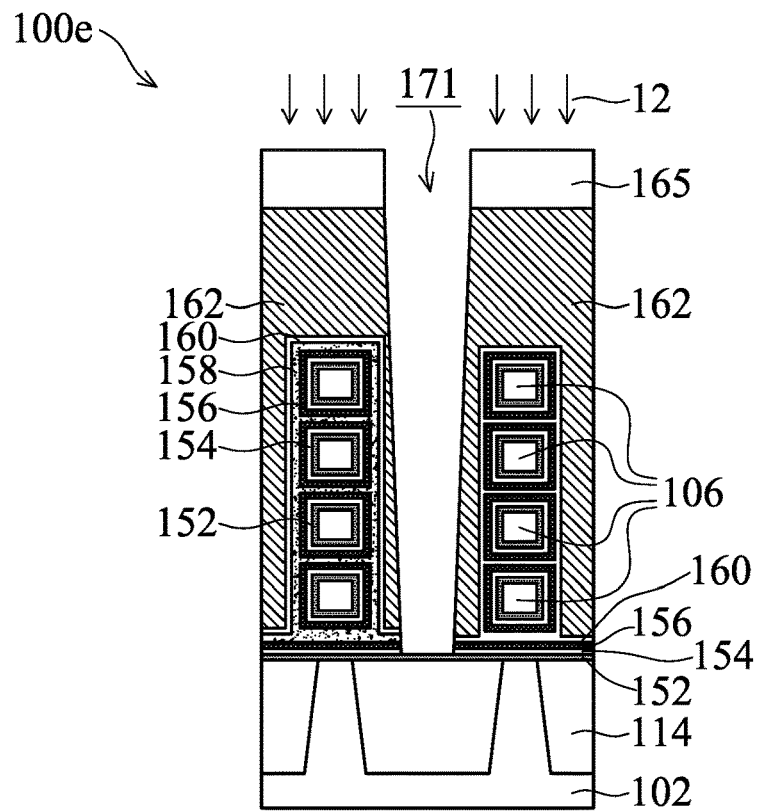

Afterwards, as shown in FIG. 5C, a portion of the block layer 160, a portion of the p-work function layer 158, a portion of the barrier layer 156, and a portion of the n-work function layer 154 are removed by the second etching process 12, in accordance with some embodiments. As a result, a top surface of the gate dielectric layer 152 is exposed.

Figure 5D:
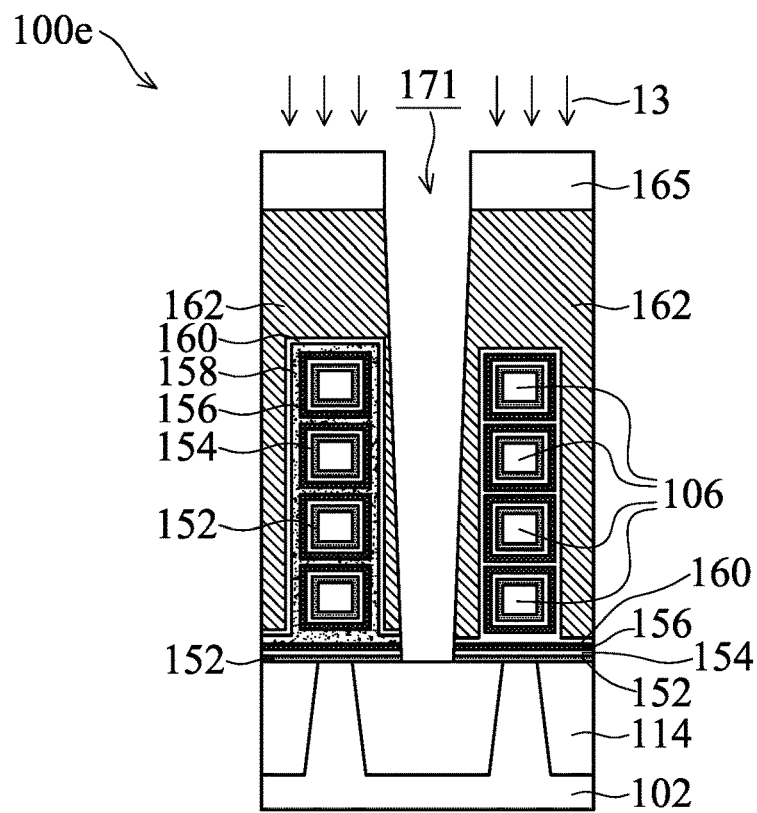

Subsequently, as shown in FIG. 5D, a portion of the gate dielectric layer 152 is removed by the third etching process 13 to expose a top surface of the isolation structure 114, in accordance with some embodiments.

Figure 5E:
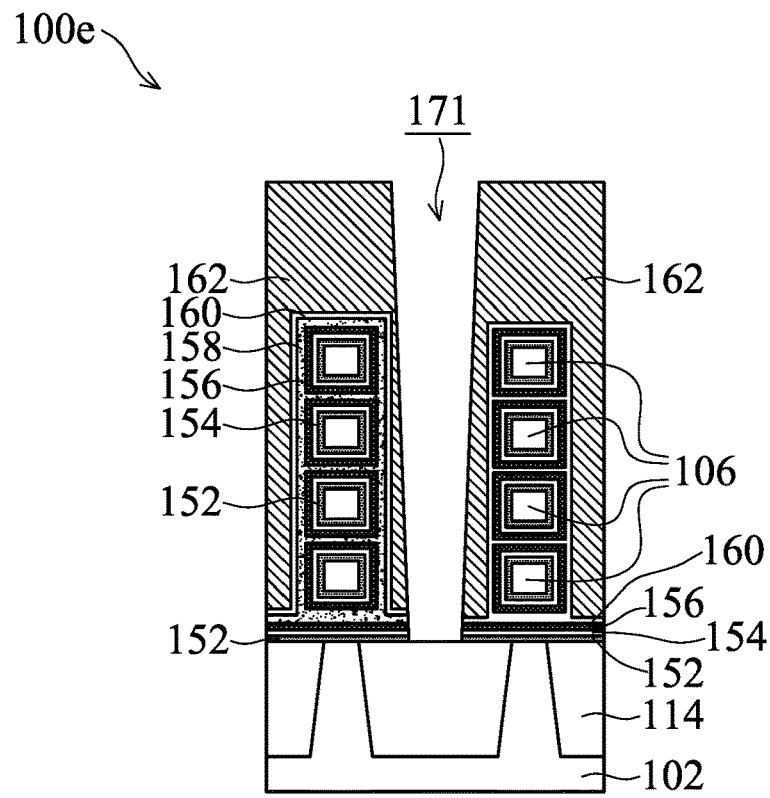

Next, as shown in FIG. 5E, the mask layer 165 is removed, in accordance with some embodiments.

Figure 5F:
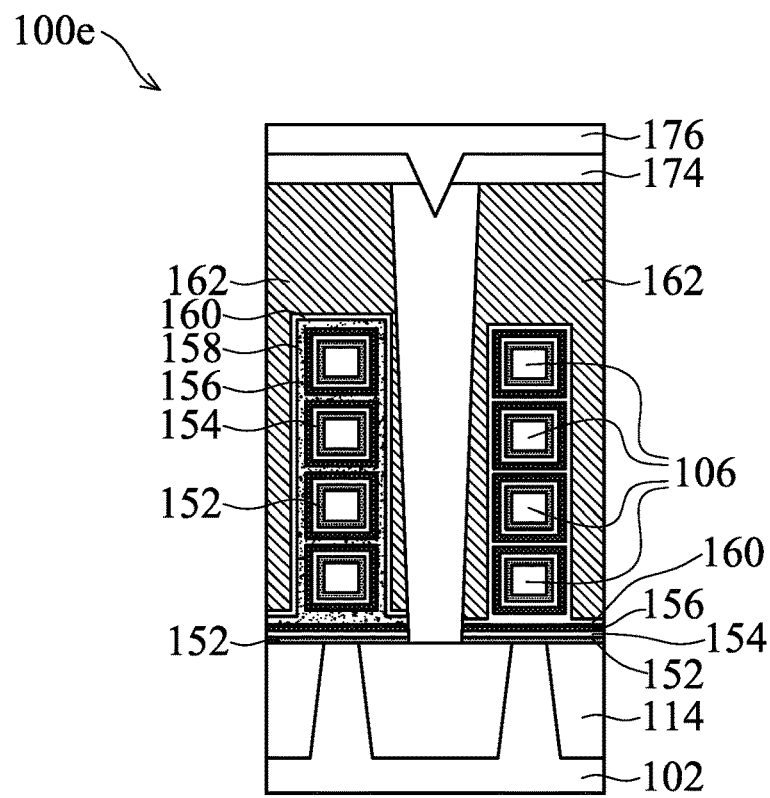

Afterwards, as shown in FIG. 5F, the first isolation sealing layer 174 is formed in the opening 171, and the second isolation sealing layer 176 is formed on the first isolation sealing layer 174, in accordance with some embodiments.

Figure 5G:
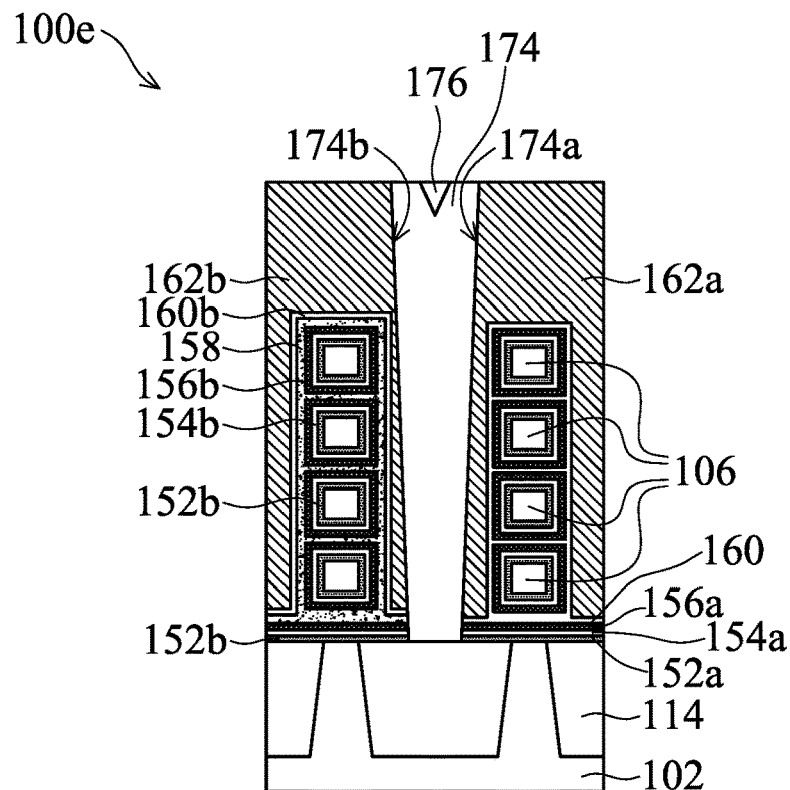
Figure 5G:
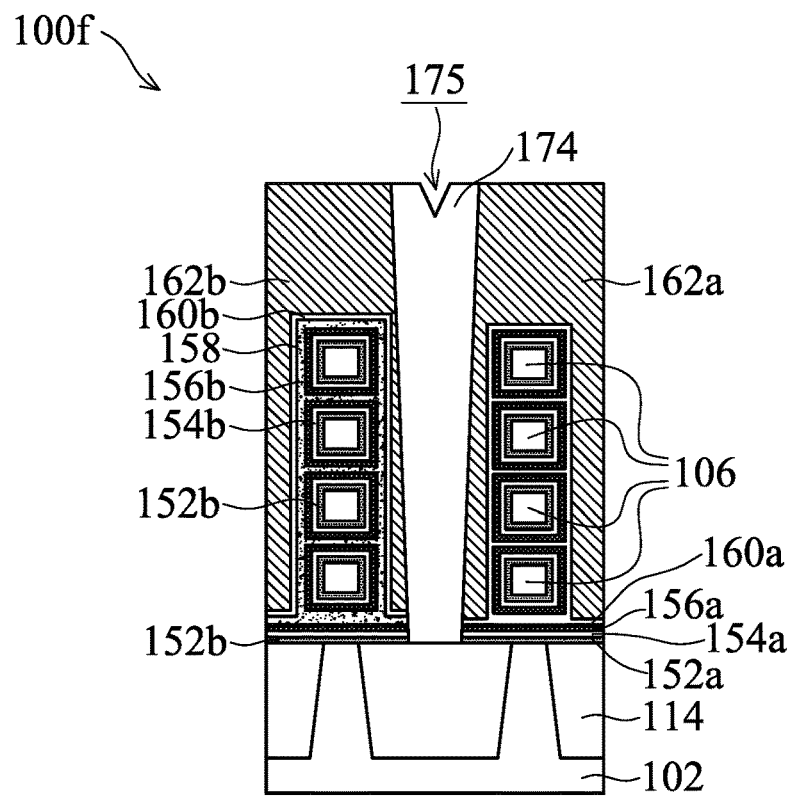

Subsequently, as shown in FIG. 5G, a portion of the first isolation sealing layer 174 and a portion of the second isolation sealing layer 176 are removed by a planarizing process, in accordance with some embodiments.

FIG. 5G' shows a cross-sectional representation of a semiconductor device structure 100f, in accordance with some embodiments of the disclosure. Some processes and materials used to form the semiconductor device structure 100f are similar to, or the same as, those used to form the semiconductor device structure 100e and are not repeated herein. The semiconductor device structure 100f of FIG. 5G' is similar to the semiconductor device structure 100e of FIG. 5G, the differences between FIG. 5G' and FIG. 5G are that no second isolation sealing layer is formed in the void 175 in FIG. 5G'. As shown in FIG. 5G', the first isolation sealing layer 174 has a V-shaped structure, and the void 175 is in the middle portion of the V-shaped structure.

Figure 6A:
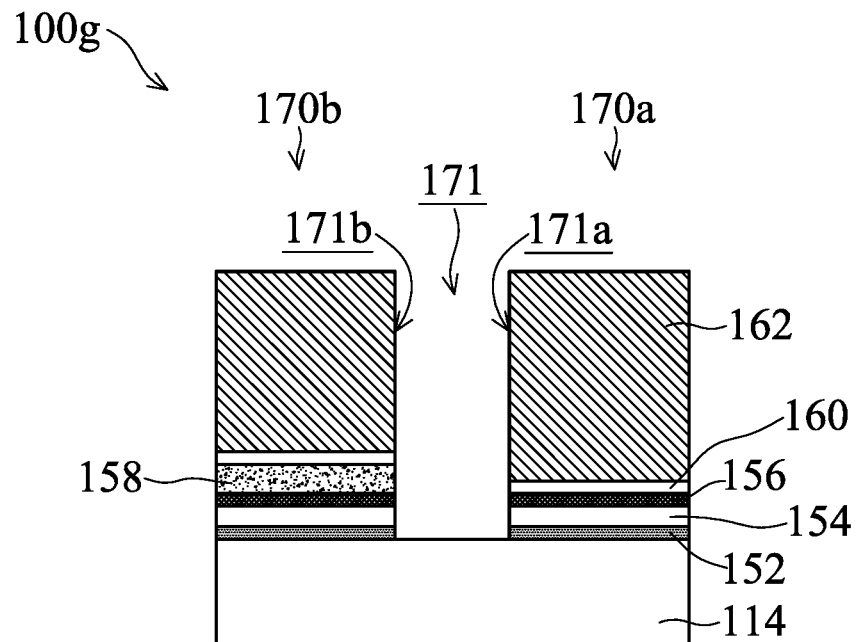
FIGS. 6A-6B show cross-sectional representations of various stages of forming the semiconductor device structure, in accordance with some embodiments of the disclosure.
Figure 6B:
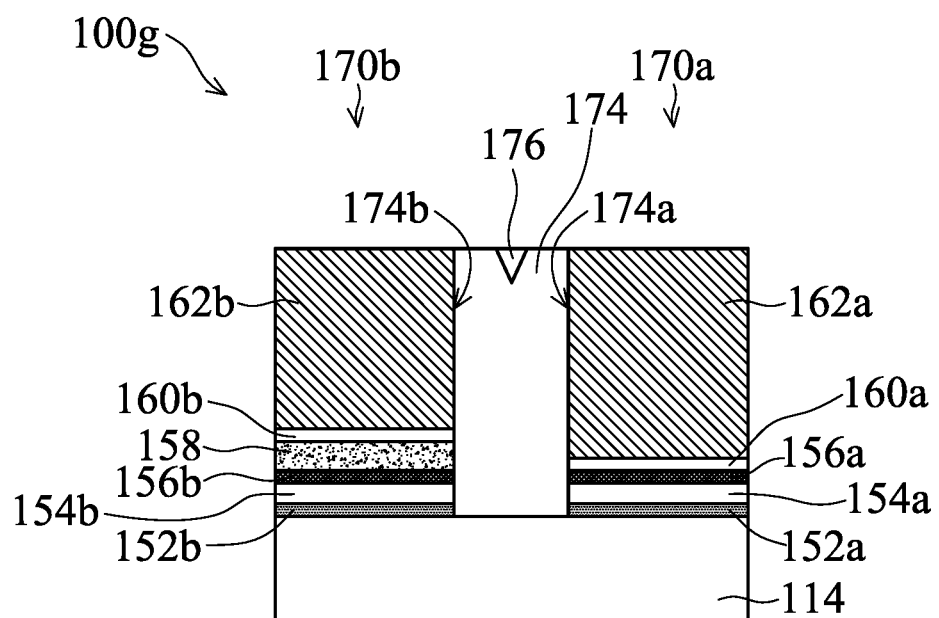

FIGS. 6A-6B show cross-sectional representations of various stages of forming the semiconductor device structure 100g, in accordance with some embodiments of the disclosure. Some processes and materials used to form the semiconductor device structure 100g are similar to, or the same as, those used to form the semiconductor device structure 100e and are not repeated herein.

As shown in FIG. 6A, the opening 171 is formed, in accordance with some embodiments of the disclosure. A portion of the filling layer 162, a portion of the block layer 160, a portion of the barrier layer 156, a portion of the n-work function layer 154 and a portion of the gate dielectric layer 152 of the first gate structure 170a are exposed by the opening 171. A portion of the filling layer 162, a portion of the block layer 160, a portion of the p-work function layer 158, a portion of the barrier layer 156, a portion of the n-work function layer 154 and a portion of the gate dielectric layer 152 of the second gate structure 170b are exposed.

The opening 171 has a first sidewall 171a and a second sidewall 171b, and the first sidewall 171a and the second sidewall 171b are symmetric. The first sidewall 171a is substantially vertical to the top surface of the isolation structure 114. In addition, the second sidewall 171b is substantially vertical to the top surface of the isolation structure 114.

In some embodiments, a portion of the filling layer 162 is removed by using an etchant, such as $Cl_2$ or another applicable material. In some embodiments, a portion of the n-work function layer 154 and a portion of the p-work function layer 158 are removed by using an etchant, such as HBr, $N_2$, $CH_2F_2$ or another applicable material.

Afterwards, as shown in FIG. 6B, the first isolation sealing layer 174 and the second isolation sealing layer 176 are formed in the opening 171, in accordance with some embodiments of the disclosure.

Figure 7A:
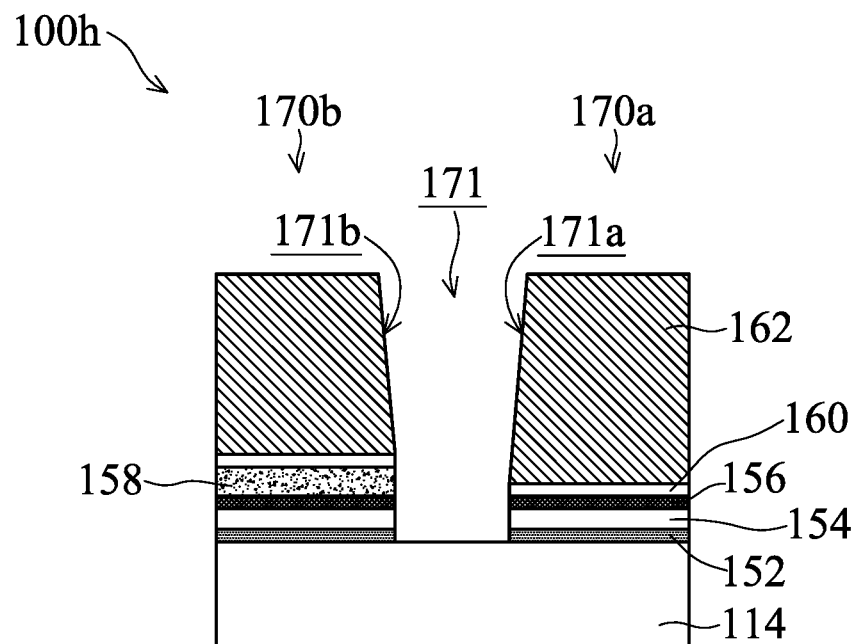
FIGS. 7A-7B show cross-sectional representations of various stages of forming the semiconductor device structure, in accordance with some embodiments of the disclosure.
Figure 7B:
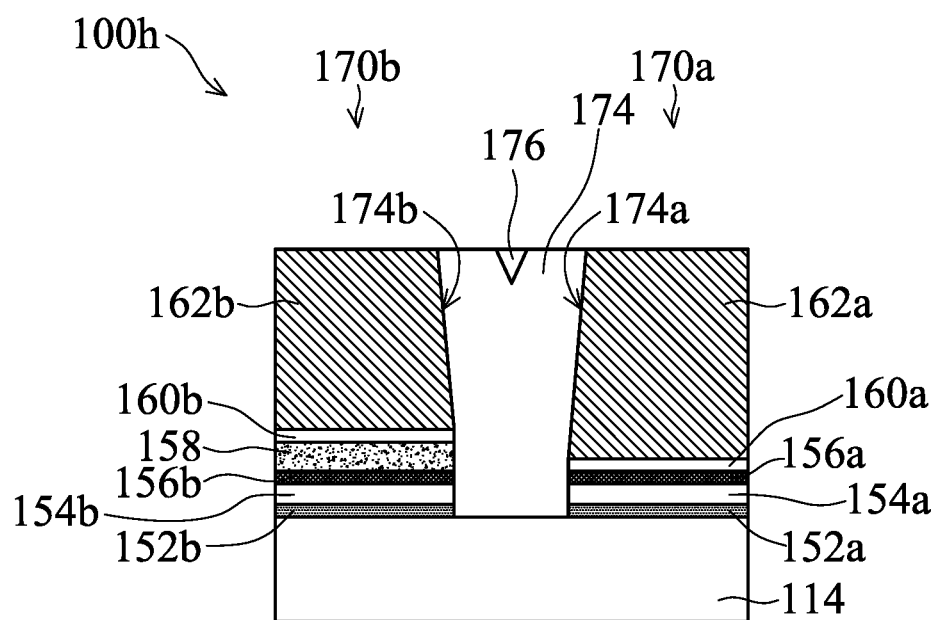

FIGS. 7A-7B show cross-sectional representations of various stages of forming the semiconductor device structure 100h, in accordance with some embodiments of the disclosure. Some processes and materials used to form the semiconductor device structure 100h are similar to, or the same as, those used to form the semiconductor device structure 100e and are not repeated herein.

As shown in FIG. 7A, the first sidewall 171a of the opening 171 has a top portion and a bottom portion. The top portion of the first sidewall 171a is the sidewall of the filling layer 162, and the top portion has a sloped sidewall. The bottom portion of the first sidewall 171a is the sidewalls of the block layer 160, the barrier layer 156, the n-work function layer 154 and the gate dielectric layer 152, and the sidewall of the bottom portion is substantially vertical to the top surface of the isolation structure 114. In some embodiments, a portion of the filling layer 162 is removed by using an etchant, such as HBr, $N_2$ or another applicable material.

As shown in FIG. 7B, the first isolation sealing layer 174 has a tapered width from top to bottom. In some embodiments, the first isolation sealing layer 174 has a top surface with a top width and a bottom surface with a bottom width, and the top width is greater than the bottom width.

Figure 8A:
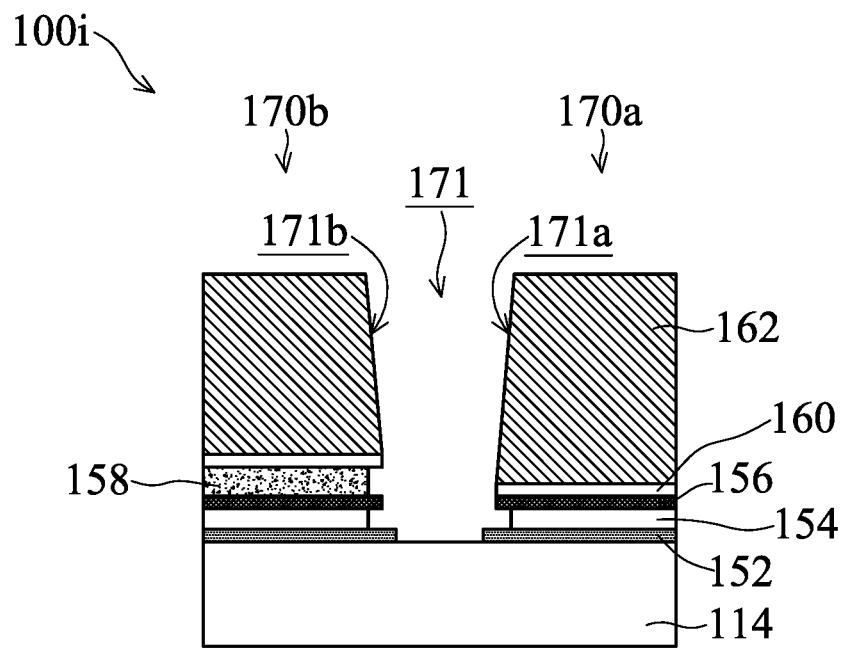
FIGS. 8A-8B show cross-sectional representations of various stages of forming the semiconductor device structure, in accordance with some embodiments of the disclosure.
Figure 8B:
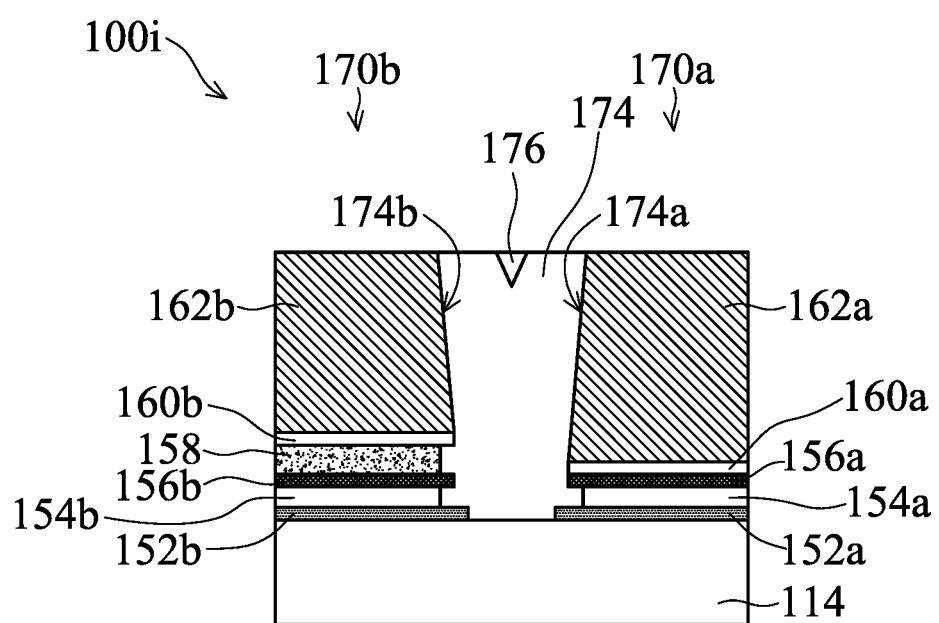

FIGS. 8A-8B show cross-sectional representations of various stages of forming the semiconductor device structure 100i, in accordance with some embodiments of the disclosure. Some processes and materials used to form the semiconductor device structure 100i are similar to, or the same as, those used to form the semiconductor device structure 100e and are not repeated herein.

As shown in FIG. 8A, since the n-work function layer 154 and the p-work function layer 158 are etched more than other layers, and therefore the first sidewall 171a and the second sidewall 171b of the opening 171 has a step-shaped structure. In some embodiments, a portion of the n-work function layer 154 and a portion of the p-work function layer 158 are removed by using an etchant, such as $Cl_2$, $NF_3$, $BCl_3$ or another applicable material.

As shown in FIG. 8B, the first isolation sealing layer 174 is formed in the opening 171, and it has a step-shaped sidewall. The first sidewall 174a and the second sidewall 174b of the first isolation sealing layer 174 are asymmetric in relating to the first isolation sealing layer 174.

Figure 9A:
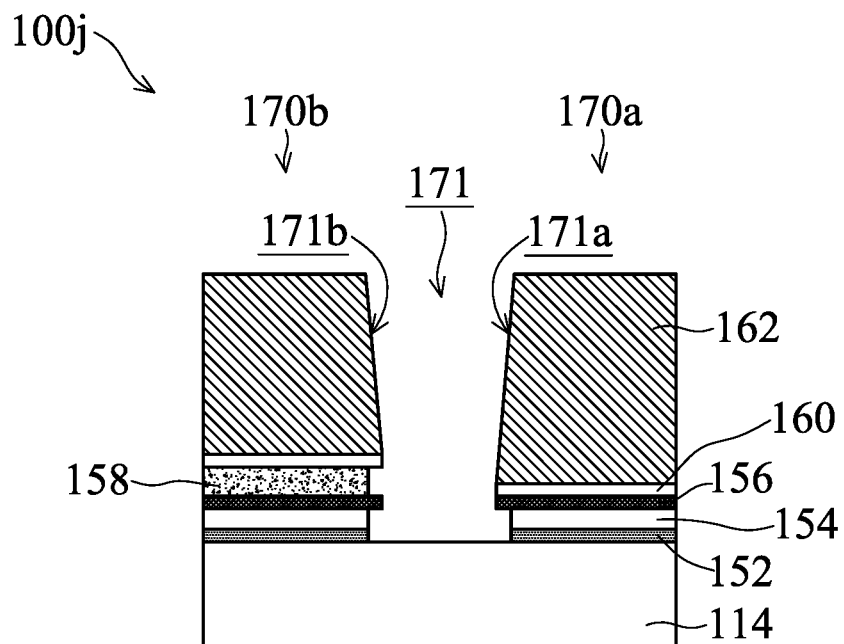
FIGS. 9A-9B show cross-sectional representations of various stages of forming the semiconductor device structure, in accordance with some embodiments of the disclosure.
Figure 9B:
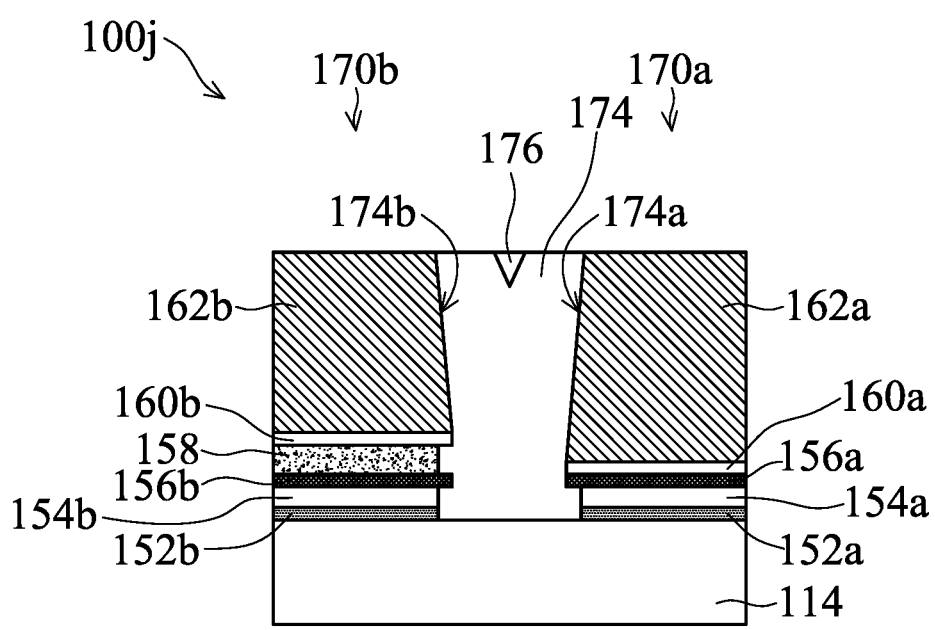

FIGS. 9A-9B show cross-sectional representations of various stages of forming the semiconductor device structure 100*j*, in accordance with some embodiments of the disclosure. Some processes and materials used to form the semiconductor device structure 100*j* are similar to, or the same as, those used to form the semiconductor device structure 100*e* and are not repeated herein.

The semiconductor device structure 100*j* of FIG. 9A is similar to the semiconductor device structure 100*i* of FIG. 8A, the differences between FIG. 9A and FIG. 8A are that the sidewall of the gate dielectric layer 152 is substantially aligned with the sidewall of the n-work function layer 154 in FIG. 9A. In some embodiments, a portion of the gate dielectric layer 152 is removed by using an etchant, such as $Cl_2$.

Afterwards, as shown in FIG. 9B, the first isolation sealing layer 174 has a step-shaped sidewall. The first sidewall 174*a* and the second sidewall 174*b* of the first isolation sealing layer 174 are asymmetric in relating to the first isolation sealing layer 174.

Embodiments for forming a semiconductor device structure and method for formation the same are provided. The semiconductor structure includes a number of the first semiconductor layers and a number of the second semiconductor layers alternately stacked. A dummy gate structure is formed over the first semiconductor layers and a number of the second semiconductor layers. The dummy gate structure is removed firstly and completely to form a trench, and then the gate structure is formed in the trench to replace the dummy gate structure. An isolation sealing layer is formed to divide the gate structure into a first gate structure and a second gate structure. Since the isolation sealing layer is formed after the gate structure is formed, the isolation sealing layer is in direct contact with multiple layers in the first gate structure and the second gate structure. In addition, since the dummy gate structure is completely removed to obtain the trench with large space for depositing the multiple layers of the gate structure. Therefore, the process window is increased and the yield of semiconductor device structure is improved.

In some embodiments, a semiconductor device structure is provided. The semiconductor device structure includes a first fin structure and a second fin structure formed over a substrate, and the first fin structure includes a plurality of first nanostructures stacked in a vertical direction, and the second fin structure includes a plurality of second nanostructures stacked in the vertical direction. The semiconductor device structure includes a first gate structure formed over the first fin structure, and the first gate structure includes a first portion of a gate dielectric layer and a first portion of a filling layer. The semiconductor device structure also includes a second gate structure formed over the second fin structure, and a first isolation sealing layer between the first gate structure and the second gate structure. The first isolation sealing layer is in direct contact with the first portion of the gate dielectric layer and the first portion of the filling layer.

In some embodiments, a semiconductor device structure is provided. The semiconductor device structure includes a first stacked nanostructure and a second stacked nanostructure formed over a substrate. A first gate structure is formed over the first stacked nanostructure. The semiconductor device structure includes a second gate structure formed over the second stacked nanostructure, and a first isolation sealing layer between the first gate structure and the second gate structure. The first isolation sealing layer has a first sidewall and a second sidewall, and the first sidewall is in direct contact with at least two different materials of the first gate structure, and the second sidewall is in direct contact with at least three different materials of the second gate structure.

In some embodiments, a method for forming a semiconductor device structure is provided. The method includes forming a dummy gate structure over a first stacked nanostructure and a second stacked nanostructure, and forming an inter-layer dielectric (ILD) layer surrounding the dummy gate structure. The method includes removing the dummy gate structure to form a trench, and forming a gate dielectric layer and a filling layer in the trench. The method further includes removing a portion of the filling layer and a portion of the gate dielectric layer to form an opening, and forming a first isolation sealing layer into the opening, such that the first isolation sealing layer is between the first gate structure and the second gate structure, and the first isolation sealing layer is in direct contact with the gate dielectric layer and the filling layer.

In some embodiments, a semiconductor device structure is provided. The semiconductor device structure includes a first fin structure and a second fin structure formed over a substrate, and the first fin structure includes a plurality of first nanostructures stacked in a vertical direction, and the second fin structure includes a plurality of second nanostructures stacked in the vertical direction. The semiconductor device structure includes a first gate structure formed over the first fin structure, and the first gate structure includes a first portion of a work function layer and a first portion of a filling layer. The semiconductor device structure also includes a second gate structure formed over the second fin structure, and the second gate structure includes a second portion of the work function layer and a second portion of the filling layer. The semiconductor device structure also includes a first isolation layer between the first gate structure and the second gate structure, and the first portion of the filling layer is isolated from the second portion of the filling layer by the first isolation layer. The first portion of the work function layer is a continuous layer surrounding the first nanostructures, and the second portion of the work function layer has a plurality of separated parts.

In some embodiments, a semiconductor device structure is provided. The semiconductor device structure includes a first stacked nanostructure and a second stacked nanostructure formed over a substrate. The semiconductor device structure includes a first gate structure formed over the first stacked nanostructure, and the first gate structure includes a first portion of a gate dielectric layer and a first portion of a filling layer. The semiconductor device structure includes a second gate structure formed over the second stacked nanostructure, and the second gate structure includes a second portion of the gate dielectric layer and a second portion of the filling layer. The semiconductor device structure includes a first isolation layer between the first gate structure and the second gate structure, and a sidewall of the first portion of the gate dielectric layer extends beyond a sidewall of the filling layer.

In some embodiments, a method for forming a semiconductor device structure is provided. The method includes forming a dummy gate structure over a first stacked nanostructure and a second stacked nanostructure. The method also includes forming an inter-layer dielectric (ILD) layer surrounding the dummy gate structure, and removing the dummy gate structure to form a trench. The method also includes forming a gate dielectric layer, a work function layer and a filling layer in the trench. The method includes removing a portion of the filling layer to form an opening, and a portion of the work function layer is exposed by the opening. The method includes removing a portion of the gate dielectric layer, and forming a first isolation layer in the opening.

In some embodiments, a semiconductor device structure is provided. The semiconductor device structure includes first nanostructures formed over a substrate, and second nanostructures formed over the substrate. The semiconductor device structure includes a first gate structure formed over the first nanostructures, and the first gate structure comprises a first portion of a filling layer. The semiconductor device structure includes a second gate structure formed over the second nanostructures, wherein the second gate structure comprises a second portion of the filling layer. The semiconductor device structure includes a first isolation layer between the first gate structure and the second gate structure. The first isolation layer has a first sidewall surface and a second sidewall surface, and a first portion of the first sidewall surface is in direct contact with the first portion of the filling layer, a second portion of the second sidewall surface is in direct contact with the second portion of the filling layer, and a first height of the first portion is greater than a second height of the second portion.

In some embodiments, a semiconductor device structure is provided. The semiconductor device structure includes a first stacked nanostructure and a second stacked nanostructure formed over a substrate. The semiconductor device structure includes a first gate structure formed over the first stacked nanostructure, and the first gate structure includes a first portion of a gate dielectric layer and a first portion of a filling layer. The semiconductor device structure includes a second gate structure formed over the second stacked nanostructure, and the second gate structure includes a second portion of the gate dielectric layer and a second portion of the filling layer. The semiconductor device structure includes a first isolation layer between the first gate structure and the second gate structure, wherein the first isolation layer has an extending portion which is formed in a recess between the gate dielectric layer and the filling layer.

In some embodiments, a method for forming a semiconductor device structure is provided. The method includes forming a first stacked nanostructure and a second stacked nanostructure, and forming a work function layer and a filling layer over the first stacked nanostructure and the second stacked nanostructure. The method includes removing a portion of the filling layer to form an opening, a portion of the work function layer protrudes from a sidewall surface of the filing layer. The method include forming a first isolation layer in the opening, wherein the first isolation layer is between the first stacked nanostructure and the second stacked nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first nanostructures formed over a substrate;
   second nanostructures formed over the substrate;
   a first gate structure formed over the first nanostructures, wherein the first gate structure comprises a first portion of a filling layer;
   a second gate structure formed over the second nanostructures, wherein the second gate structure comprises a second portion of the filling layer; and
   a first isolation layer between the first gate structure and the second gate structure, wherein the first isolation layer has a first sidewall surface and a second sidewall surface, and a first portion of the first sidewall surface is in direct contact with the first portion of the filling layer, a second portion of the second sidewall surface is in direct contact with the second portion of the filling layer, and a first height of the first portion is greater than a second height of the second portion.

2. The semiconductor device structure as claimed in claim 1, wherein first isolation layer has a tapered width from top to bottom.

3. The semiconductor device structure as claimed in claim 1, further comprising:
   an isolation structure formed over the substrate, wherein the first isolation layer is directly on the isolation structure.

4. The semiconductor device structure as claimed in claim 1, wherein a bottommost surface of the second portion of the filling layer is higher than a bottommost surface of the first portion of the filling layer.

5. The semiconductor device structure as claimed in claim 1, further comprising:
   a second isolation layer formed over the first isolation layer.

6. The semiconductor device structure as claimed in claim 1, wherein the second gate structure further comprises a work function layer, and the work function layer is in direct contact with the first isolation layer.

7. The semiconductor device structure as claimed in claim 6, wherein the first gate structure does not comprise the work function layer.

8. The semiconductor device structure as claimed in claim 1, wherein the first isolation layer has a step-shaped sidewall when seen from a cross-sectional view.

9. The semiconductor device structure as claimed in claim 1, wherein the first sidewall surface of the first isolation layer is sloped.

10. A semiconductor device structure, comprising:
    a first stacked nanostructure and a second stacked nanostructure formed over a substrate;
    a first gate structure formed over the first stacked nanostructure, wherein the first gate structure comprises a first portion of a gate dielectric layer and a first portion of a filling layer;
    a second gate structure formed over the second stacked nanostructure, wherein the second gate structure comprises a second portion of the gate dielectric layer and a second portion of the filling layer; and
    a first isolation layer between the first gate structure and the second gate structure, wherein the first isolation layer has an extending portion which is formed in a recess between the gate dielectric layer and the filling layer.

11. The semiconductor device structure as claimed in claim 10, further comprising:
    an isolation structure formed over the substrate, wherein the first isolation layer is directly on the isolation structure.

12. The semiconductor device structure as claimed in claim 10, wherein the second gate structure comprises a layer which surrounds the first stacked nanostructure, and the layer is not formed in the first gate structure.

13. The semiconductor device structure as claimed in claim 10, wherein the second gate structure further comprises a n-work function layer and a p-work function layer, and n-work function layer and the p-work function layer are in direct contact with the first isolation layer.

14. The semiconductor device structure as claimed in claim 10, wherein a bottom surface of the first portion of the filling layer is lower than a bottom surface of the second portion of the filling layer.

15. The semiconductor device structure as claimed in claim 10, further comprising:
a second isolation layer formed on the first isolation layer, wherein the first isolation layer has recessed portion, and the second isolation layer is formed in the recessed portion.

16. The semiconductor device structure as claimed in claim 10, wherein a portion of the gate dielectric layer protrudes from a sidewall surface of the filling layer.

17. A method for forming a semiconductor device structure, comprising:
forming a first stacked nanostructure and a second stacked nanostructure;
forming a work function layer and a filling layer over the first stacked nanostructure and the second stacked nanostructure;
removing a portion of the filling layer to form an opening, wherein a portion of the work function layer protrudes from a sidewall surface of the filing layer; and
forming a first isolation layer in the opening, wherein the first isolation layer is between the first stacked nanostructure and the second stacked nanostructure.

18. The method for forming the semiconductor device structure as claimed in claim 17, further comprising:
forming a portion of the work function layer to form a recess between the filling layer and the work function layer; and
forming the first isolation layer in the recess.

19. The method for forming the semiconductor device structure as claimed in claim 17, wherein the work function layer is formed over the second stacked nanostructure, but not formed over the first stacked nanostructure.

20. The method for forming the semiconductor device structure as claimed in claim 17, further comprising:
forming a second isolation layer on the first isolation layer, wherein the first isolation layer has a V-shaped structure, and the second isolation layer is formed in a middle portion of the V-shaped structure.

* * * * *